US012652981B2

(12) United States Patent     (10) Patent No.:   US 12,652,981 B2

Liu et al.            (45) Date of Patent:     Jun. 9, 2026

(54) METHOD OF FIN SELECTION FOR IMPROVED PERFORMANCE IN SEMICONDUCTOR DEVICES

(71) Applicant: Taiwan Semiconductor Manufacturing Company, Ltd., Hsinchu (TW)

(72) Inventors: Shellin Liu, Hsinchu (TW); Jui-Tse Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 351 days.

(21) Appl. No.: 17/879,610

(22) Filed: Aug. 2, 2022

(65) Prior Publication Data

US 2024/0046021 A1     Feb. 8, 2024

(51) Int. Cl.
| | |
|---|---|
| *H10P 50/00* | (2026.01) |
| *G06F 30/392* | (2020.01) |
| *H10D 84/01* | (2025.01) |
| *H10D 84/03* | (2025.01) |
| *H10P 76/40* | (2026.01) |
| *H10W 20/00* | (2026.01) |

(52) U.S. Cl.
CPC .......... *H10P 50/695* (2026.01); *G06F 30/392* (2020.01); *H10D 84/0158* (2025.01); *H10D 84/038* (2025.01); *H10P 50/73* (2026.01); *H10P 76/4085* (2026.01); *H10P 76/4088* (2026.01); *H10W 20/089* (2026.01)

(58) Field of Classification Search
None
See application file for complete search history.

(56) References Cited

U.S. PATENT DOCUMENTS

| | | | |
|---|---|---|---|
| 8,796,666 B1 | 8/2014 | Huang | |
| 8,822,243 B2 | 9/2014 | Yan | |
| 8,987,142 B2 | 3/2015 | Lee | |
| 9,053,279 B2 | 6/2015 | Chang | |
| 9,093,530 B2 | 7/2015 | Huang | |
| 9,099,530 B2 | 8/2015 | Lin | |
| 9,153,478 B2 | 10/2015 | Liu | |
| 9,268,896 B1 * | 2/2016 | Tang ......................... G03F 1/70 | |

(Continued)

FOREIGN PATENT DOCUMENTS

TW        202027231 A     7/2020

*Primary Examiner* — Jiong-Ping Lu
(74) *Attorney, Agent, or Firm* — HAYNES AND BOONE, LLP

(57) ABSTRACT

A method includes receiving an integrated circuit (IC) design layout that includes a design boundary and a pair of design fin patterns having a fin spacing and a fin pitch. The method further includes creating a mandrel mask pattern, which includes determining an edge of the mandrel mask pattern based on a location of the design boundary, the fin spacing, and the fin pitch, and determining a width of the mandrel mask pattern based on the fin spacing and the fin pitch. The method further includes creating a cut mask pattern based on the mandrel mask pattern and the design fin patterns, wherein the cut mask pattern is configured to protect an area of a semiconductor wafer corresponding to the design fin patterns. The method further includes fabricating a mandrel mask having the mandrel mask pattern and fabricating a cut mask having the cut mask pattern.

20 Claims, 25 Drawing Sheets

(56) References Cited

U.S. PATENT DOCUMENTS

| | | | |
|---|---|---|---|
| 9,501,601 B2 | 11/2016 | Chang | |
| 9,548,303 B2 | 1/2017 | Lee | |
| 9,876,114 B2 | 1/2018 | Jangjian | |
| 2015/0021710 A1* | 1/2015 | Hsu | H10D 84/0133 |
| | | | 257/401 |
| 2016/0190305 A1 | 6/2016 | JangJian et al. | |

* cited by examiner

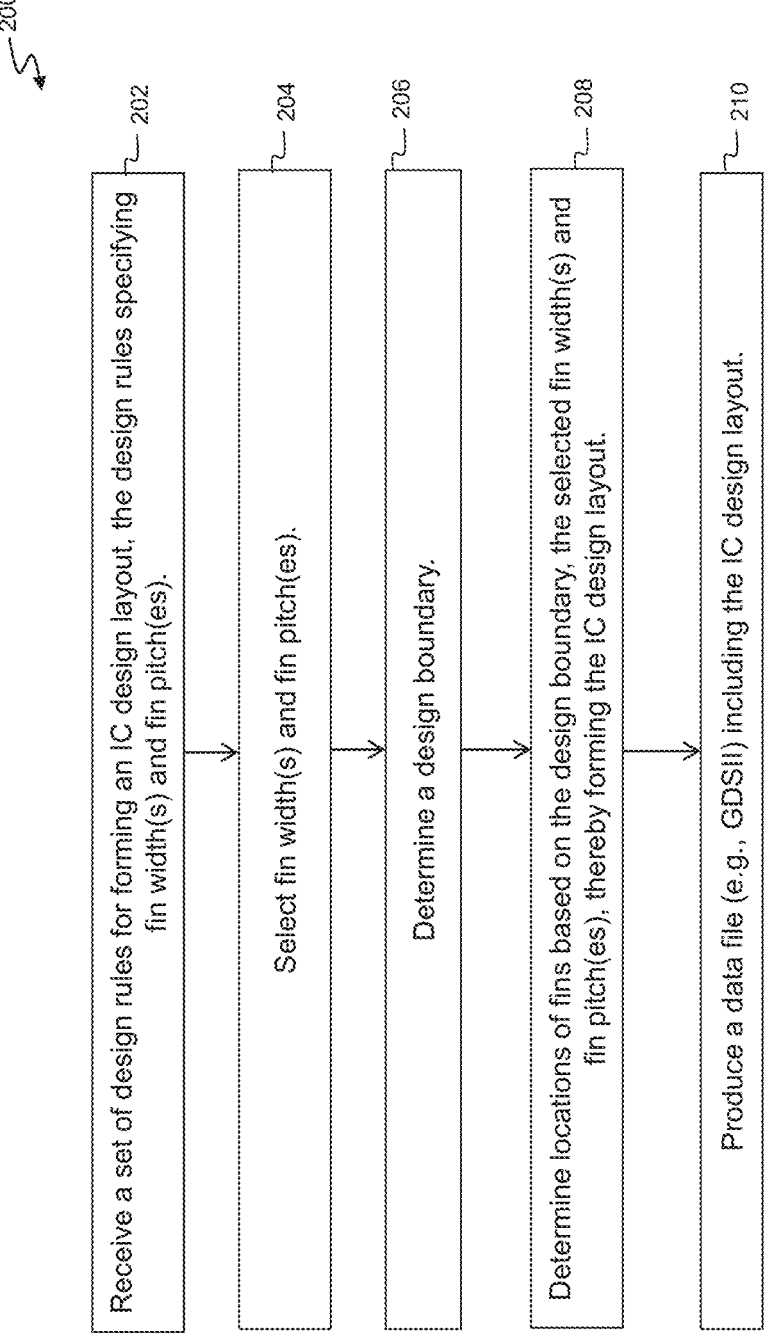

200

202 — Receive a set of design rules for forming an IC design layout, the design rules specifying fin width(s) and fin pitch(es).

204 — Select fin width(s) and fin pitch(es).

206 — Determine a design boundary.

208 — Determine locations of fins based on the design boundary, the selected fin width(s) and fin pitch(es), thereby forming the IC design layout.

210 — Produce a data file (e.g., GDSII) including the IC design layout.

Fin Design 1

Fin Design 3

Fin Design 4

Receive a data file (e.g., GDSII) including an IC design layout that includes a design boundary and fins — 302

Derive a mandrel mask pattern and a cut mask pattern based on the IC design layout and a mandrel-spacer-spacer manufacturing process. — 304

Manufacture a set of masks including a mandrel mask with the mandrel mask pattern and a cut mask with the cut mask pattern. — 306

300

Cut Mask for Fin Design 1

Cut Mask for Fin Design 2

Cut Mask for Fin Design 4

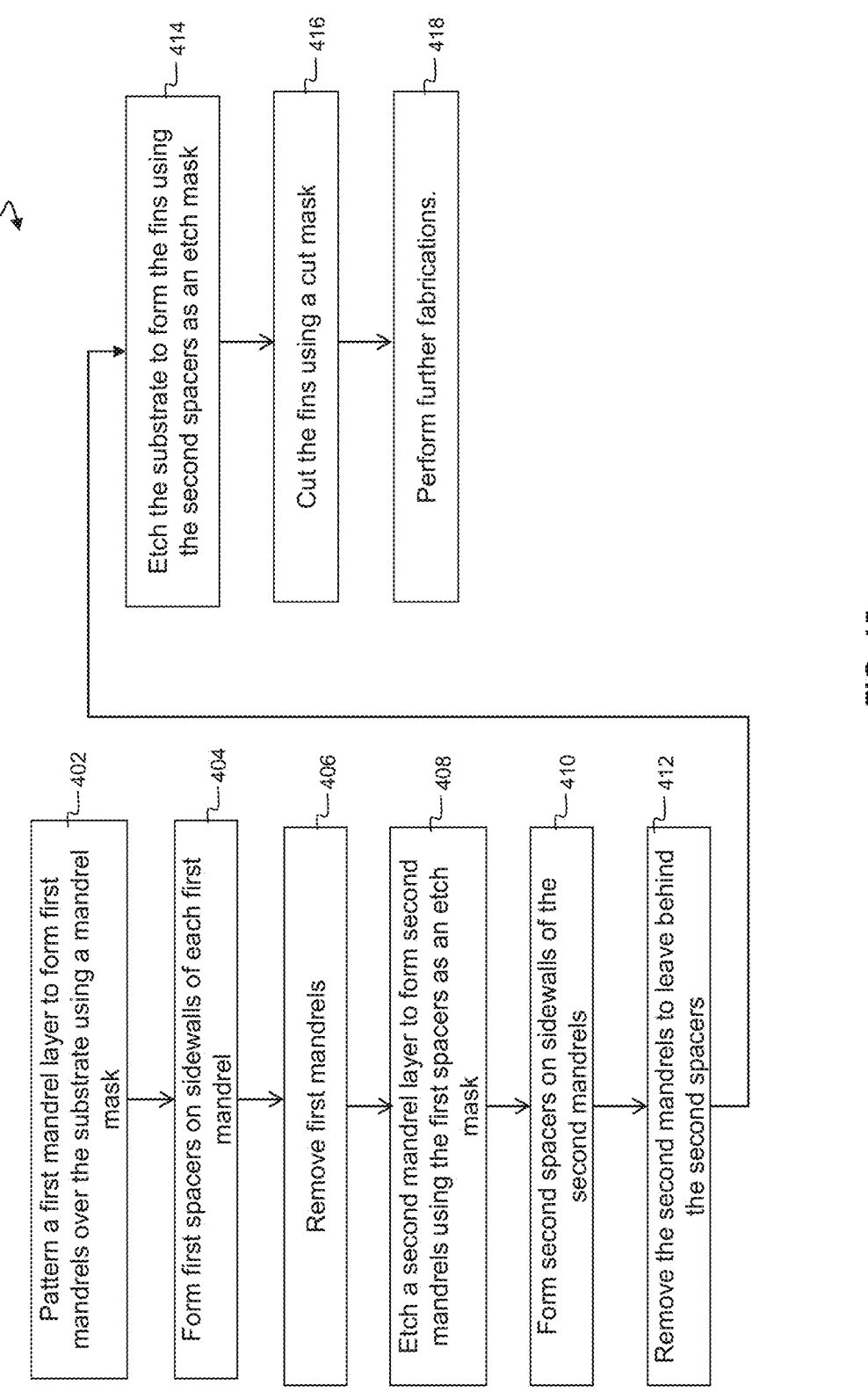

400

402 Pattern a first mandrel layer to form first mandrels over the substrate using a mandrel mask 404 Form first spacers on sidewalls of each first mandrel 406 Remove first mandrels 408 Etch a second mandrel layer to form second mandrels using the first spacers as an etch mask 410 Form second spacers on sidewalls of the second mandrels 412 Remove the second mandrels to leave behind the second spacers 414 Etch the substrate to form the fins using the second spacers as an etch mask 416 Cut the fins using a cut mask 418 Perform further fabrications.

FIG. 15

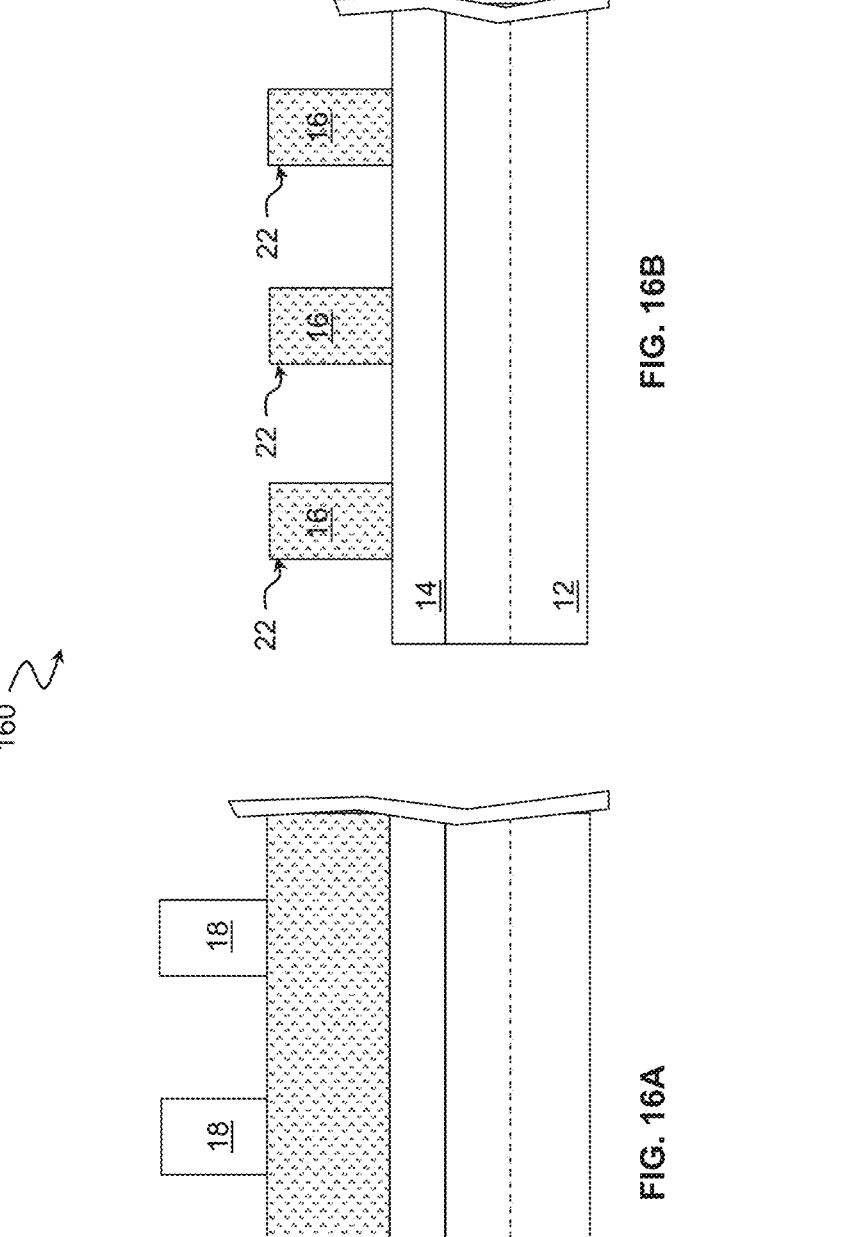
FIG. 16B
FIG. 16A

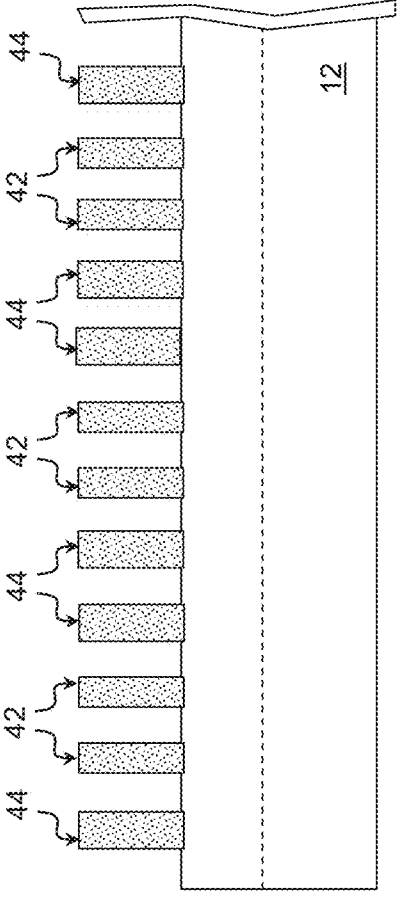
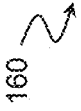
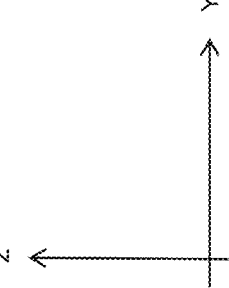
FIG. 16H

METHOD OF FIN SELECTION FOR IMPROVED PERFORMANCE IN SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

Such scaling down has also increased the complexity of processing and manufacturing ICs and, for these advances to be realized, similar developments in IC processing and manufacturing are needed. For example, when forming semiconductor fins (or fin active regions) using a mandrel-spacer-spacer patterning process, variations from a series of deposition and etching processes may lead to differences in the dimensions (e.g., fin width) of the resulting fins. While existing methods of IC fabrication using the mandrel-spacer-spacer patterning process are generally adequate, they are not entirely satisfactory. For example, improvements in producing fins with predictable and consistent widths are desired.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a flowchart of a method of designing an example IC according to various aspects of the present disclosure.

FIGS. 5, 6, 7, and 8 illustrate four examples of fin designs according to various aspects of the present disclosure.

FIG. 15 illustrates a flowchart of a method of manufacturing an example IC device using mandrel and cut masks according to various aspects of the present disclosure.

FIGS. 16A, 16B, 16C, 16D, 16E, 16F, 16G, 16H, and 16I illustrate cross-sectional views of the example IC device during intermediate steps of one or more methods provided by various aspects of the present disclosure.

DETAILED DESCRIPTION

Figure 1:
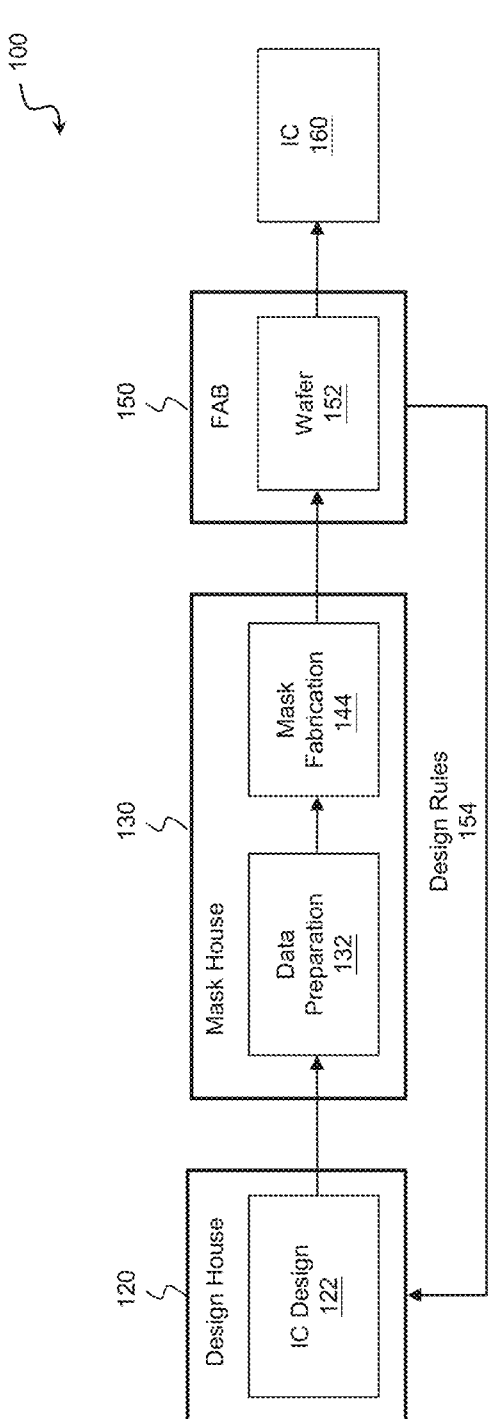
FIG. 1 illustrates a simplified block diagram of an embodiment of an example IC manufacturing system and an associated IC manufacturing flow.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in various examples to indicate same or similar elements.

FIG. 1 is a simplified block diagram of an embodiment of an IC manufacturing system 100 and an IC manufacturing flow associated therewith. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an IC device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single company, and may even coexist in a common facility and use common resources.

The design house (or design team) 120 generates an IC design layout 122 according to a set of design rules 154 provided by the IC manufacturer 150. The design house 120 may perform various tasks, such as shown in FIG. 4 (which will be further explained) in order to produce the IC design layout 122. The IC design layout 122 includes various geometrical patterns designed for the IC device 160, based on a specification of the IC device 160 and the set of design rules 154. The geometrical patterns correspond to patterns of metal, oxide, or semiconductor layers that make up the various components of the IC device 160 to be fabricated. For example, FIGS. 5, 6, 7, and 8 illustrate geometrical patterns 52 and 54 that correspond to semiconductor fins that may be used to form FinFETs or gate-all-around devices. The various layers combine to form various IC features. For example, a portion of the IC design layout 122 includes various IC features, such as an active region (such as semiconductor fins), gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format, DFII file format, or other suitable file formats.

The mask house 130 uses the IC design layout 122 to manufacture one or more masks (or photomasks or reticles) to be used for fabricating the various layers of the IC device 160 according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation. The mask data preparation 132 may include optical proximity correction (OPC), mask rule checking (MRC), lithography process checking (LPC), or other functions.

After mask data preparation 132 and during mask fabrication 144, a mask or a group of masks are fabricated. For example, an electron-beam (e-beam) or a mechanism of multiple e-beams is used to form a pattern on a mask based on the mask data. The mask can be formed in various technologies. In one embodiment, the mask is formed with opaque regions and transparent regions. A radiation beam, such as an ultraviolet (UV) beam, used to expose an image sensitive material layer (e.g., photoresist) coated on a wafer, is blocked by the opaque region and transmits through the transparent regions. In another embodiment, the mask is formed with reflective regions and non-reflective (or absorptive) regions. A radiation beam, such as an extreme ultraviolet (EUV) beam, used to expose an image sensitive material layer (e.g., photoresist) coated on a wafer, is reflected by the reflective region and is absorbed by the non-reflective regions. In another example, the mask is formed using a phase shift technology, where various features formed on the mask are configured to have proper phase difference to enhance the resolution and imaging quality.

The IC manufacturer 150, such as a semiconductor foundry, uses the mask (or masks) fabricated by the mask house 130 to fabricate the IC device 160. The IC manufacturer 150 is an IC fabrication business that can include a myriad of manufacturing facilities for the fabrication of a variety of different IC products. For example, there may be a manufacturing facility for the front-end fabrication of a plurality of IC products (i.e., front-end-of-line (FEOL) fabrication), while a second manufacturing facility may provide the back-end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 160. The semiconductor wafer includes a silicon substrate or other proper substrate having material layers formed thereon. Other proper substrate materials include another suitable elementary semiconductor, such as germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
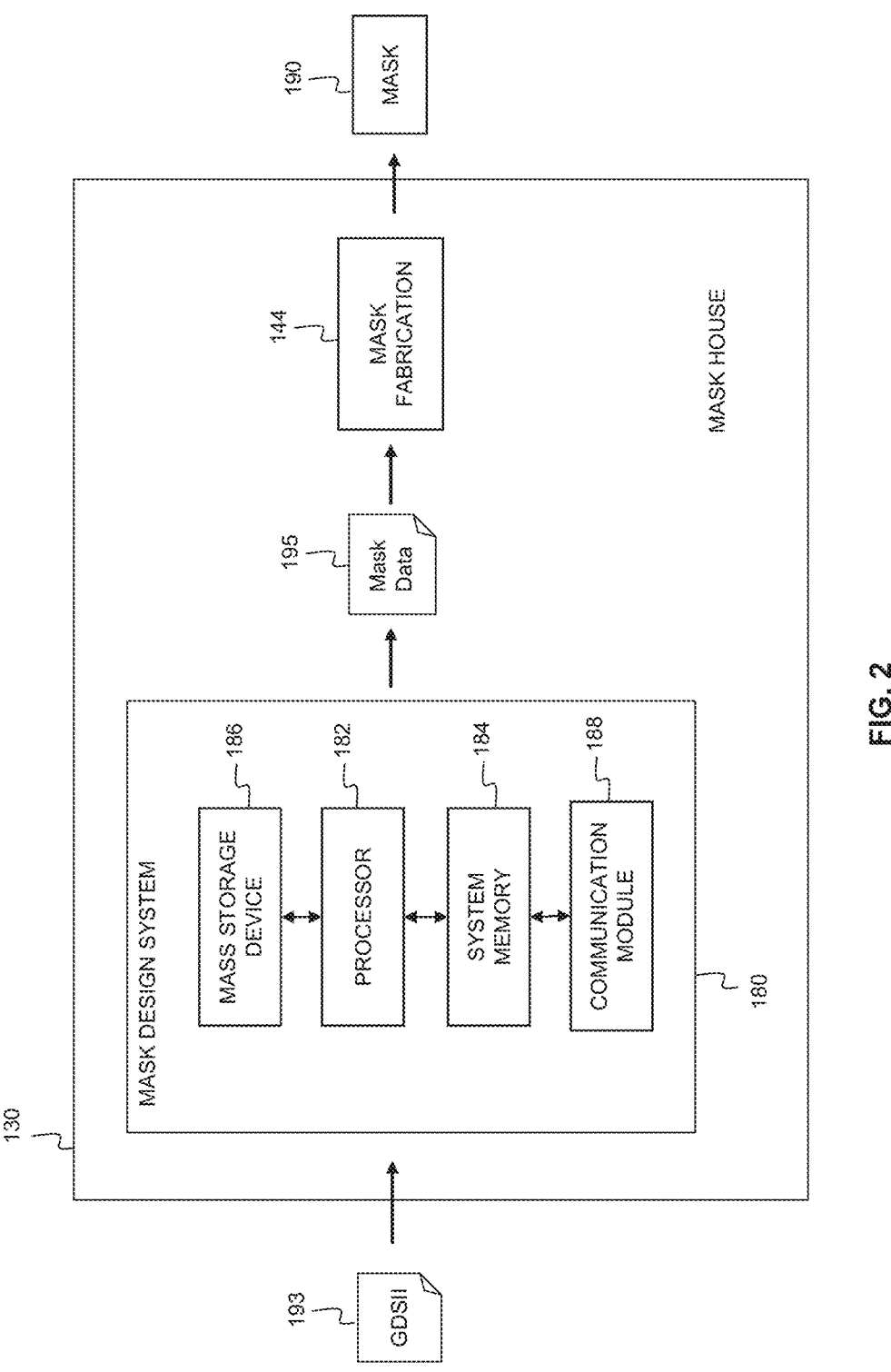
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1, including one or more operations shown in FIG. 9. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in one embodiment, operations 302 and 304 in FIG. 9 may be implemented as software instructions executing on the mask design system 180. In such an embodiment, the mask design system 180 receives a GDSII file 193 containing the IC design layout 122 from the design house 120. After the mask data preparation 132 is complete, the mask design system 180 transmits mask data 195 to mask fabrication 144. In an embodiment, the mask data 195 includes mask patterns for making mandrel patterns (referred to as mandrel mask patterns) and cut pattern (referred to as cut mask patterns). The mandrel and cut mask patterns may be used by the IC manufacturer 150 to produce semiconductor fins. In alternative embodiments, the IC design layout 122 may be transmitted in alternate file formats such as DFII, CIF, OASIS, or any other suitable file type. Further, the mask design system 180 and the mask house 130 may include additional and/or different components in alternative embodiments.

Figure 3:
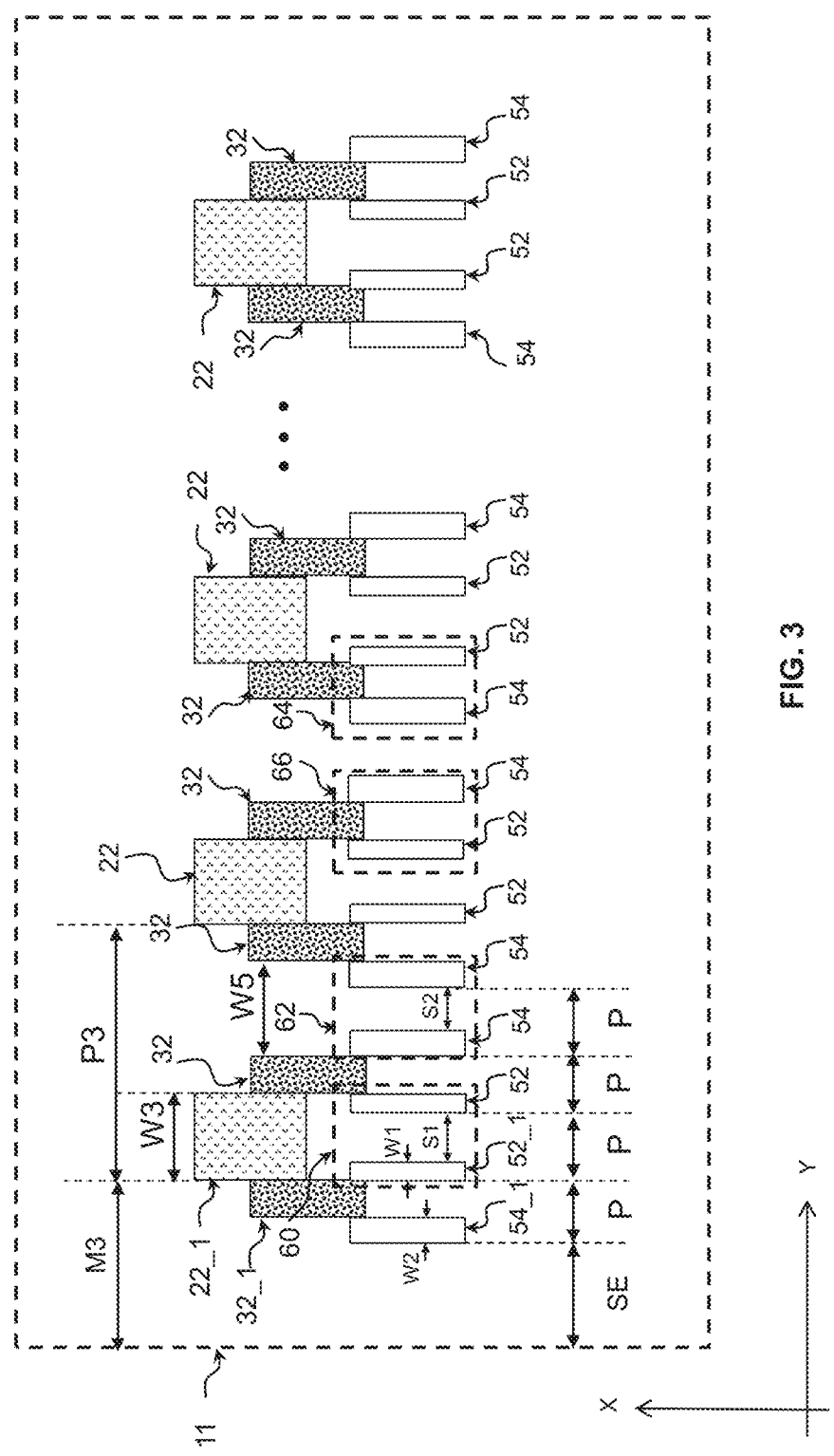
FIG. 3 shows a schematic illustration of mandrel-spacer-spacer patterning process for manufacturing fins in the FAB 150 shown in FIG. 1 according to various aspects of the present disclosure.

FIG. 3 is a simplified schematic of a mandrel-spacer double patterning process performed by the IC manufacturer 150. Particularly, FIG. 3 illustrates mandrels 22, spacers 32, and semiconductor fins (or simply fins) 52 and 54. The fins 52 and 54 may be included, wholly or partially, in the IC 160. For convenience of viewing, the mandrels 22, spacers 32, and fins 52 and 54 are illustrated as offset from each other along the "X" direction, while in fact the spacers 32 are formed on the edges (or sidewalls) of the mandrels 22 or derivatives thereof, and the fins 52 and 54 are formed on the edges (or sidewalls) of the spacers 32 or derivatives thereof. In other words, the edges of the mandrels 22, spacers 32, and fins 52 and 54 are coextensive with each other along the "X" direction in the manufacturing process.

FIG. 3 also illustrates a design boundary 11, which may be a boundary for a block of SRAM cells or a block of logic cells, for example. The fins 50 have a fin pitch P. The mandrels 22 are separated from each other by a mandrel pitch P3 and each have a width W3 measured along the Y direction. Furthermore, the mandrel 22 closest to the design boundary 11, denoted "22_1," is separated from the design boundary 11 by a distance M3. In the present embodiments, the pitch P3 is about four times P or (4×P).

The spacers 32 are deposited on the sidewalls of each mandrel 22. In this regard, two spacers 32 formed on two adjacent mandrels 22 are separated by a distance W5. While it is generally desirable for the distances W3 and W5 to be substantially the same, variations in the photolithography and/or etching processes (e.g., operations of method 400) may result in the distance W5 to be greater than the distance W3. For this and other reasons, the fins (i.e., the fins 54) formed in the space with a width defined by the distance W5 have different widths from those (i.e., the fins 52) formed in the space with a width defined by the distance W3. In the present embodiment, the fins 52 are each defined by a width W1 and the fins 54 are each defined by a width W2 that is greater than the width W1. Because the fins 52 and 54 are configured with a substantially constant fin pitch P, fin spacing S1 between two neighboring fins 52 is greater than fin spacing S2 between two neighboring fins 54. Furthermore, a distance SE between the design boundary 11 and the fin (e.g., the fin 54_1) that is the closest to the design boundary 11 is defined by SE. In an embodiment, the distance SE is configured to be equal to (P+S1/2) (i.e., P plus half S1).

In certain IC designs, it is desirable to implement a transistor (such as an NMOSFET or a PMOSFET) or multiple transistors using a pair of fins. For some designs, it is further desirable that the widths of the fins in the pair match each other, such as two fins 52 or two fins 54. Further, sometimes it is desirable to form many devices (such as an array of SRAM cells or an array of logic cells) with substantially the same fin widths. For example, each cell in an array of SRAM cells have a pair of fins that have substantially the same fin widths, such as a pair of fins 52 or a pair of fins 54. The uniformity of fin width may increase the uniformity of transistor performance. In some other designs, it may be desired to have a pair of fins that do not have the same width, such as one narrower fin 52 and one wider fin 54. However, it is further desirable that all pairs of fins in an array are made similar, i.e., each pair has a narrower fin 52 and a wider fin 54. Based on the above discussion, it is apparent that grouping of the fins 52 and/or 54 may be important to certain IC designs and it may be desirable and advantageous that many pairs of fins in an IC design have consistent widths among them. For example, for an area defined by the design boundary 11, it may be desirable that all pairs of fins therein are group-60 fins, i.e., a pair of fins 52 (two narrower fins); or that all pairs of fins therein are group-62 fins, i.e., a pair of fins 54 (two wider fins); or that all pairs of fins therein are group-64 fins, i.e., a pair of fins 54 and 52 (left fin wider than right fin); or that all pairs of fins therein are group-66 fins, i.e., a pair of fins 52 and 54 (left fin narrower than right fin). Further, it may be undesirable or disadvantageous to use pairs of fins that are inconsistent within the design boundary 11. For example, it may be undesirable to use a pair of narrower fins 52 and a pair of wider fins 54 within the same design boundary 11.

Still further, at the design stage, it is desirable that the design house 120 has control over the widths of the fins in the IC Design 122. In other words, the design house 120 can choose the pairing of the fins (such as groups 60, 62, 64, or 66) within any design boundary. Further, the design house 120 may choose different pairing of the fins within different design boundaries. For example, the design house 120 may use pairs of narrower fins 52 in one device region (defined by a first design boundary) and use pairs of wider fins 54 in another device region (defined by a second design boundary). Having the above design capabilities allows the IC design 122 to be optimized.

In this regard, the IC manufacturer 150 provides design rules 154 to the design house 120, which enables the design house 120 to choose the desired fin pairing, which is further discussed below in association with FIG. 4.

FIG. 4 illustrates a flowchart of a method 200 of designing an example IC according to various aspects of the present disclosure. Method 200 is merely an example and is not intended to limit the present disclosure beyond what is explicitly recited in the claims. Additional operations can be provided before, during, and after method 200, and some operations described can be replaced, eliminated, or moved around for additional embodiments of the method 200.

Referring to FIG. 4, at operation 202, the method 200 receives a set of design rules 154. The design rules 154 specify fin width(s), fin pitch(es), fin spacing, and the distance SE from a design boundary to the fins. In an embodiment, the design rules 154 specify fins with two different widths, a narrower fin having a width W1 (e.g., fin 52 in FIG. 3) and a wider fin having a width W2 (e.g., fin 54 in FIG. 3). The design rules 154 also specify the fin pitch P and/or fin spacing S1 (or S2). The design rules 154 are based on empirical data gathered by the IC manufacturer 150 on the same process that the IC design 122 is targeted. The design rules 154 allow the design house 120 to choose the pairing of fins, such as two narrower fins, two wider fins, a narrower fin and a wider fin, or a wider fin and a narrower fin.

Further, the design rules 154 specify the distance from the design boundary to the pairs of fins depending on the pairing of fins the design house 120 chooses. If the design house 120 chooses two narrower fins 52 (or group 60), then the distance from the design boundary to the pairs of fins along the Y direction is $(2 \times P + S1/2 + i \times 4 \times P)$ where i is a natural number. If the design house 120 chooses two wider fins 54

(or group 62), then the distance from the design boundary to the pairs of fins along the Y direction is $(4 \times P + S1/2 + i \times 4 \times P)$ where i is a natural number. If the design house 120 chooses a wider left fin 54 and a narrower right fin 52 (or group 64), then the distance from the design boundary to the pairs of fins along the Y direction is $(P + S1/2 + i \times 4 \times P)$ where i is a natural number. If the design house 120 chooses a narrower left fin 52 and a wider right fin 54 (or group 66), then the distance from the design boundary to the pairs of fins along the Y direction is $(3 \times P + S1/2 + i \times 4 \times P)$ where i is a natural number.

At operation 204, the method 200 selects the desired fin widths and fin pitch. The method 200 may select different fin widths and fin pitches for different design blocks each defined by a respective design boundary. For each design within a design boundary, the design house 120 may choose two narrower fins 52 (or group-60 fins), two wider fins 54 (or group-62 fins), a wider left fin 54 and a narrower right fin 52 (or group-64 fins), or a narrower left fin 52 and a wider right fin 54 (or group-66 fins). It is noted that during the design stage, the fins 52 and 54 may be drawn (in layout) with the same width and the spacing between fins may be the same (all being S1). The different fin widths are reflected in the distance between the chosen fins and the design boundary 11. The actual fins with the chosen width(s) are made by the IC manufacturer 150 using a mandrel-spacer-spacer patterning process.

At operation 206, the method 200 determines a design boundary 11. The design boundary 11 surrounds or defines an area where the selected fins 52 and/or 54 will be implemented.

At operation 208, the method 200 determines locations of the fins. Specifically, the distance from the design boundary to the pairs of fins along the Y direction is determined based the design rules 154, the design boundary, and the selected fin width(s) and fin pitch(es), as discussed above. FIGS. 5, 6, 7, and 8 illustrates four different fin designs. The fins 52 and 54 in FIGS. 5, 6, 7, and 8 are also referred to as design fin patterns.

Figure 5:
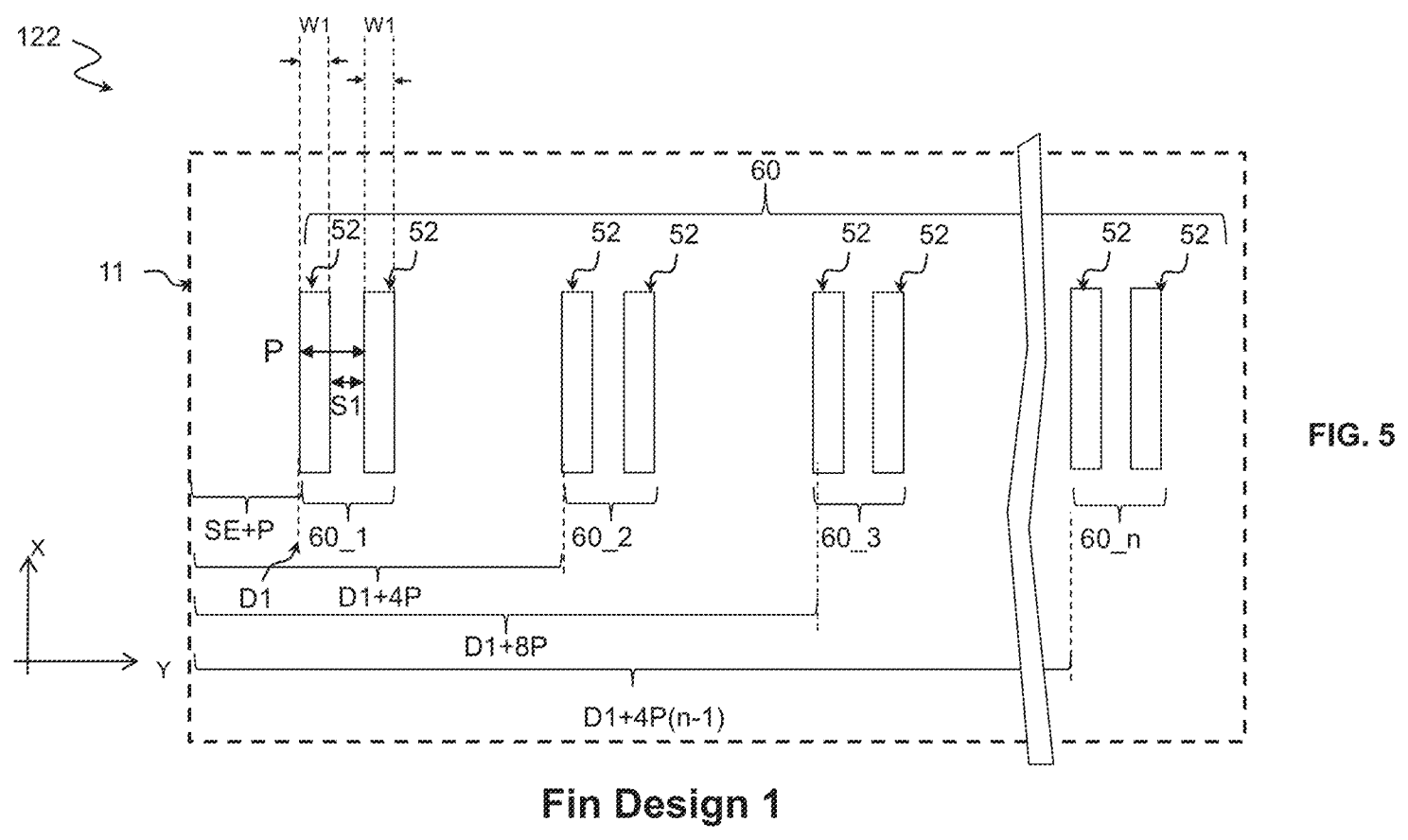

FIG. 5 illustrates an example where the design house 120 chooses two narrower fins 52 (or group-60 fins) to be a pair of fins. FIG. 5 illustrates n pairs of fins 52 labeled as 60_1, 602, 60_3, . . . 60_n. In FIGS. 5-8, the "SE" is specified in the design rules 154, which is equal to $(P + S1/2)$ in an embodiment. As shown, the distance from the design boundary 11 to any pairs of fins along the Y direction is $(4 \times P + S1/2 + i \times 4 \times P)$ where i is a natural number. For example, i is 0 for the leftmost pair of fins and is 1 for the second pair of fins from the left, and so on.

Figure 6:
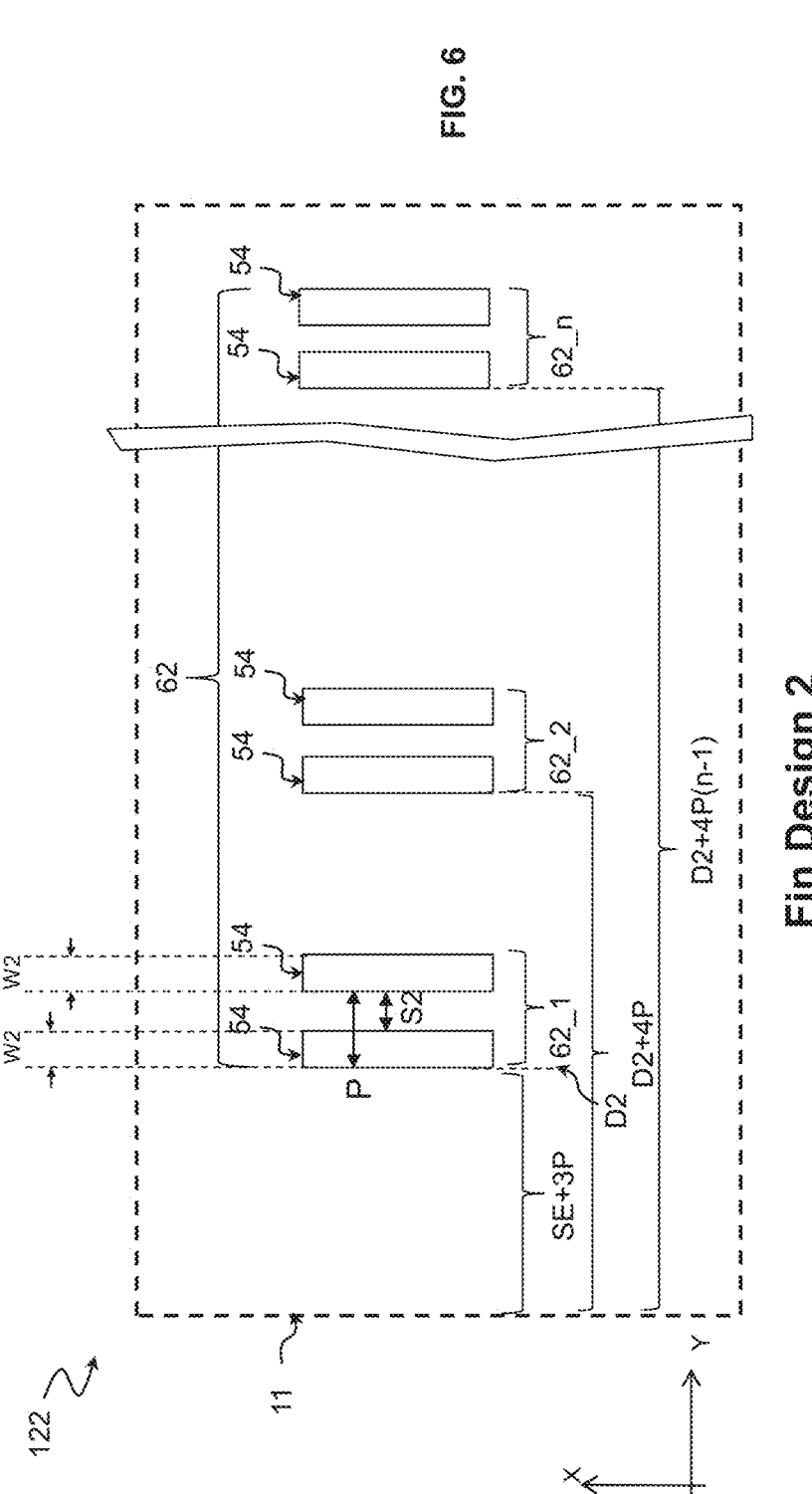

FIG. 6 illustrates an example where the design house 120 chooses two wider fins 54 (or group-62 fins) to be a pair of fins. FIG. 6 illustrates n pairs of fins 54 labeled as 62_1, 62_2, . . . 62_n. As shown, the distance from the design boundary 11 to any pairs of fins along the Y direction is $(4 \times P + S1/2 + i \times 4 \times P)$ where i is a natural number. For example, i is 0 for the leftmost pair of fins and is 1 for the second pair of fins from the left, and so on.

Figure 7:
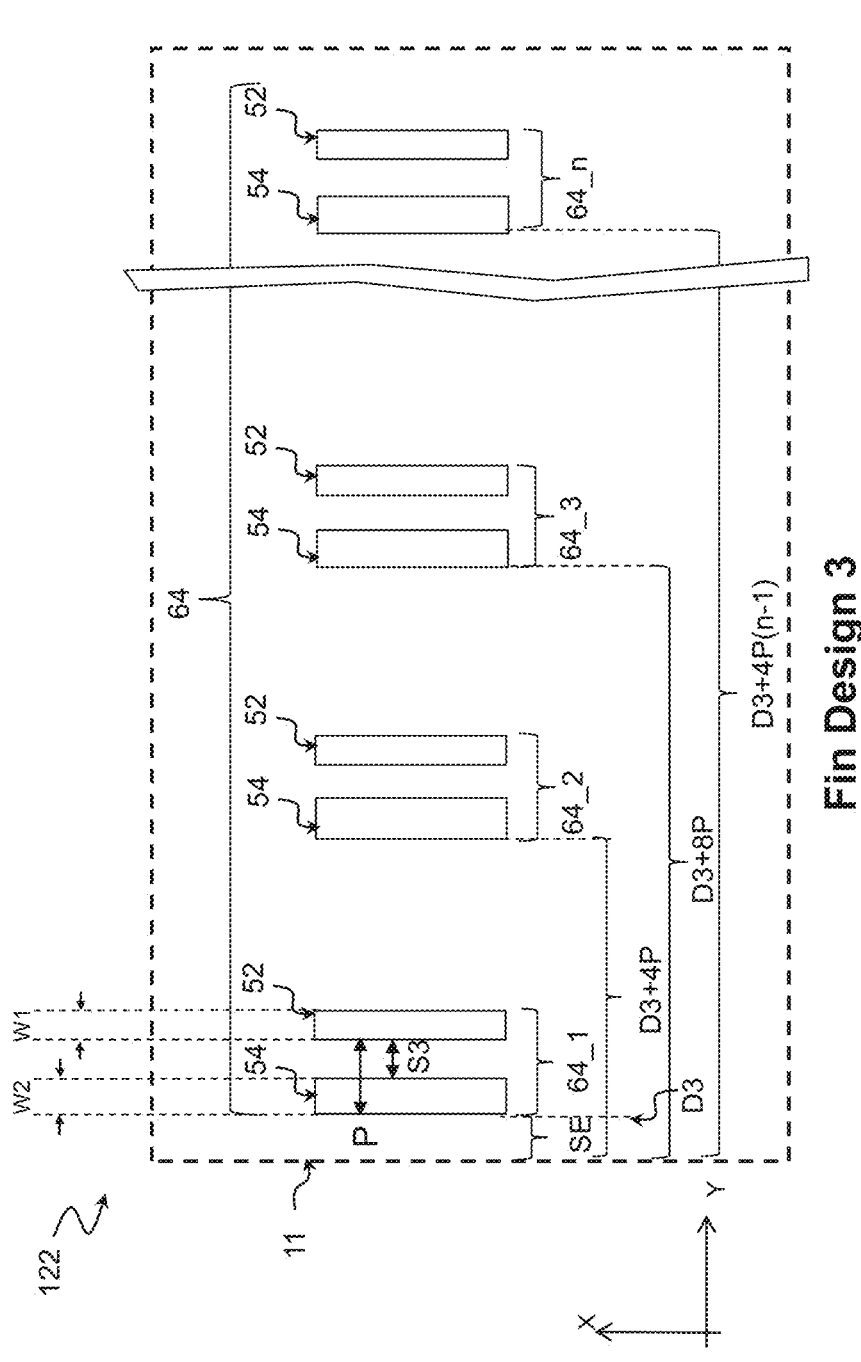

FIG. 7 illustrates an example where the design house 120 chooses a wider left fin 54 and a narrower right fin 52 (or group-64 fins) to be a pair of fins. FIG. 7 illustrates n pairs of fins 54/52 labeled as 64_1, 642, 64_3, . . . 64_n. As shown, the distance from the design boundary 11 to any pairs of fins along the Y direction is $(P + S1/2 + i \times 4 \times P)$ where i is a natural number. For example, i is 0 for the leftmost pair of fins and is 1 for the second pair of fins from the left, and so on.

Figure 8:
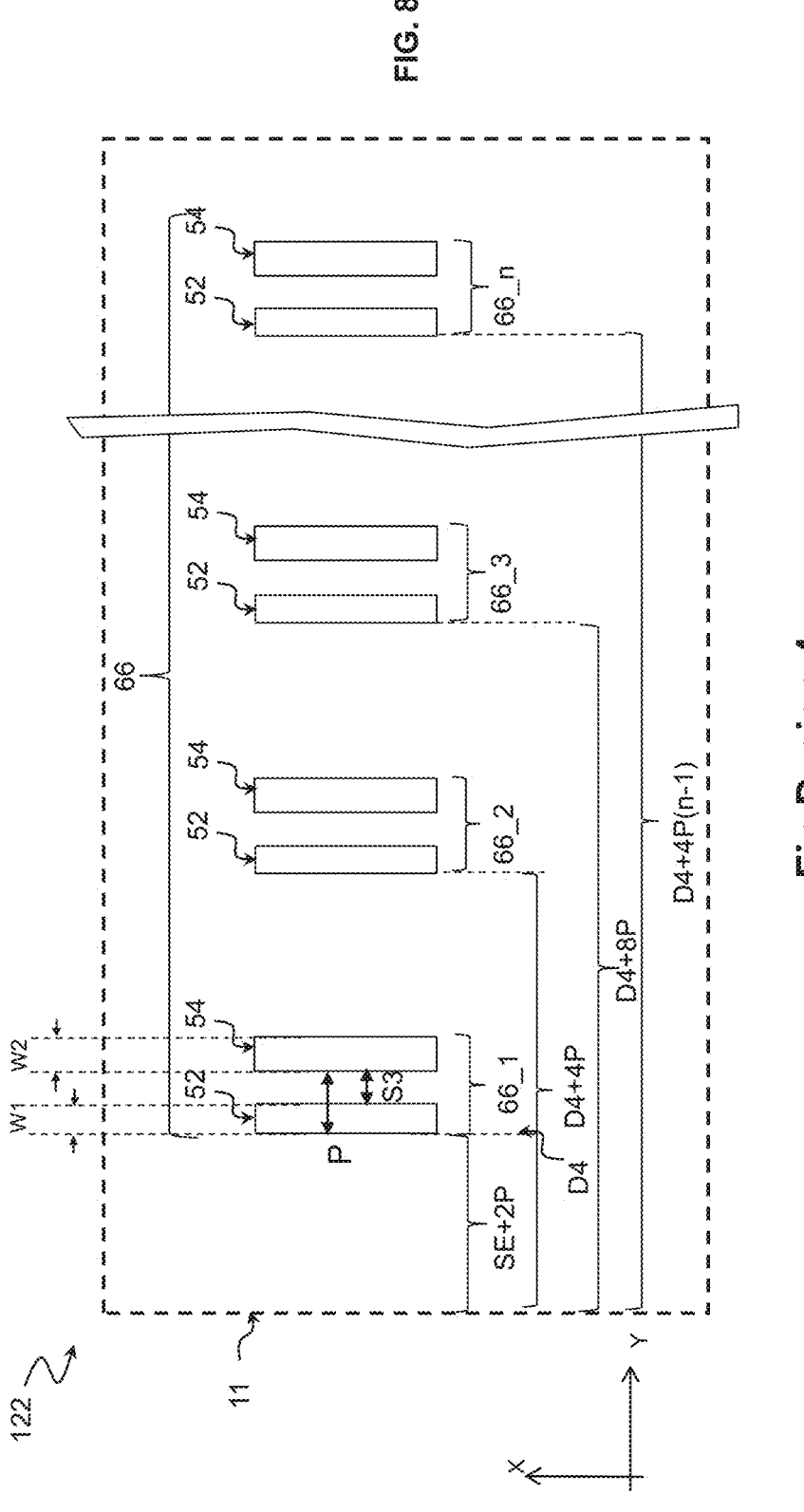

FIG. 8 illustrates an example where the design house 120 chooses a narrower left fin 52 and a wider right fin 54 (or group-66 fins) to be a pair of fins. FIG. 8 illustrates n pairs of fins 52/54 labeled as 66_1, 66_2, 66_3, . . . 66_n. As shown, the distance from the design boundary 11 to any pairs of fins along the Y direction is $(3 \times P + S1/2 + i \times 4 \times P)$ where i is a natural number. For example, i is 0 for the leftmost pair of fins and is 1 for the second pair of fins from the left, and so on.

At operation 208, the method 200 may determine the lengths of the fins as well as the location and size of other patterns, such as gate patterns, metal lines, etc.

At operation 210, the method 200 produces a data file, such as in GDSII format or another suitable format, that contains the IC design layout including fins 52 and/or 54 designed according to the operation 208.

Figure 9:
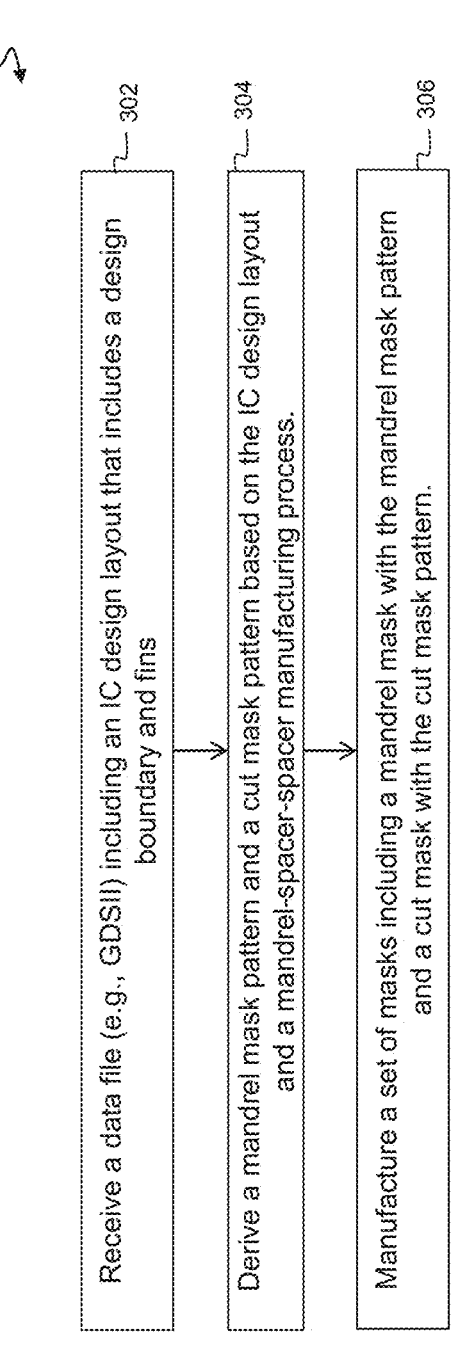
FIG. 9 illustrates a flowchart of a method of forming masks (or photomasks) for an example IC device according to various aspects of the present disclosure.

FIG. 9 illustrates a flowchart of a method 300 of making IC masks 190 according to various aspects of the present disclosure. Method 300 is merely an example and is not intended to limit the present disclosure beyond what is explicitly recited in the claims. Additional operations can be provided before, during, and after method 300, and some operations described can be replaced, eliminated, or moved around for additional embodiments of the method 300.

Referring to FIG. 9, at operation 302, the method 300 receives a data file, such as in GDSII format or another suitable format. In an embodiment, the data file contains an IC design layout 122 including a design boundary 11 and design fin patterns 52 and/or 54 designed according to the operation 208 discussed above, such as fin patterns 52 and/or 54 shown in FIG. 5, 6, 7, or 8.

In an embodiment, the design fin patterns 52 and/or 54 are to be manufactured by the IC manufacturer 150 using a mandrel-spacer-spacer manufacturing process. To use such manufacturing process, the method 300 at operation 304 converts the design fin patterns 52 and/or 54 in the data file to mandrel mask patterns 22 and cut mask patterns 172. In an embodiment, operation 304 includes determining an edge of a mandrel mask pattern 22 based on a location of the design boundary 11, fin spacing S1 (or S2), fin width W1 (or W2), and fin pitch P. It is noted that fin pitch equals to fin width plus fin spacing. Therefore, if two of the three parameters (fin spacing, fin width, fin pitch) are known, the third one can be derived accordingly. Operation 304 further includes determining a width of the mandrel mask pattern 22 based on the fin spacing, fin width, and the fin pitch.

In an embodiment, the edge of a mandrel mask pattern 22 is determined by calculating a distance from the design boundary 11 to the edge of the mandrel mask pattern 22. As shown in FIG. 3, the distance M3 from the design boundary 11 to the edge of the mandrel mask pattern 22 is (SE+P) which is $(2 \times P + S1/2)$. In other words, the distance M3 equals to twice of fin pitch P plus half fin spacing S1 or twice of the fin width W1 plus two and half times of the fin spacing S1. When the fins are the group-62 or group-66 fins (such as shown in FIGS. 6 and 8), the edge of the mandrel mask pattern is between the design boundary and the leftmost fin (see FIG. 3). When the fins are the group-60 fins (such as shown in FIG. 5), the edge of the mandrel mask pattern is aligned with an outer edge of the leftmost fin (see FIG. 3). When the fins are the group-64 fins (such as shown in FIG. 7), the edge of the mandrel mask pattern is aligned with an inner edge of the fin that is the second from the leftmost (see FIG. 3). An outer edge of a fin referring to the edge of the fin that is away from the other fin in the pair of fins. An inner edge of a fin referring to the edge of the fin that faces the other fin in the pair of fins.

Figure 10:
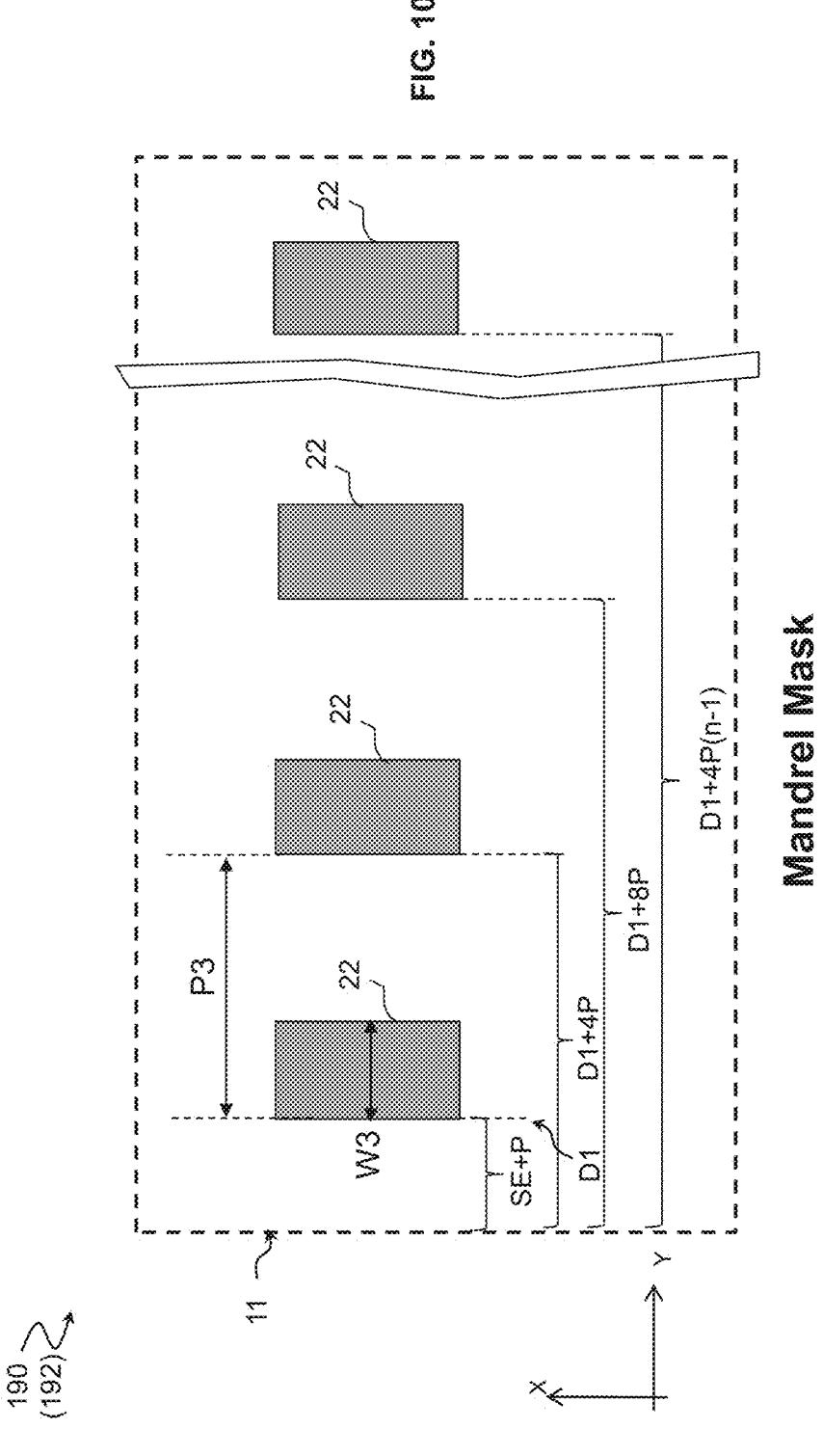
FIGS. 10, 11, 12, 13, and 14 illustrate examples of mandrel and cut mask patterns according to various aspects of the present disclosure.

Further, as shown in FIG. 3, the width W3 of the mandrel mask pattern equals to fin pitch P plus fin width W1, i.e., W3=(P+W1). The width W3 also equals to twice of the fin pitch P minus the fin spacing S1, or twice of the fin width W1 plus the fin spacing S1. The determined mandrel mask pattern 22 is the leftmost mandrel mask pattern 22_1. Once the leftmost mandrel mask pattern 22_1 is determined, the other mandrel mask patterns 22 are determined by the mandrel pitch P3 which equals to (4×P) or (4×(W1+S1)). Further, the other mandrel mask patterns 22 have the same width as the leftmost mandrel mask pattern 22_1. Operation 304 also determines the length of the mandrel mask patterns 22 along the "X" direction, which is equal to or greater than the length of the design fin patterns 52 and/or 54. FIG. 10 shows mandrel mask patterns 22 determined by the operation 304 according to an embodiment.

Figure 11:
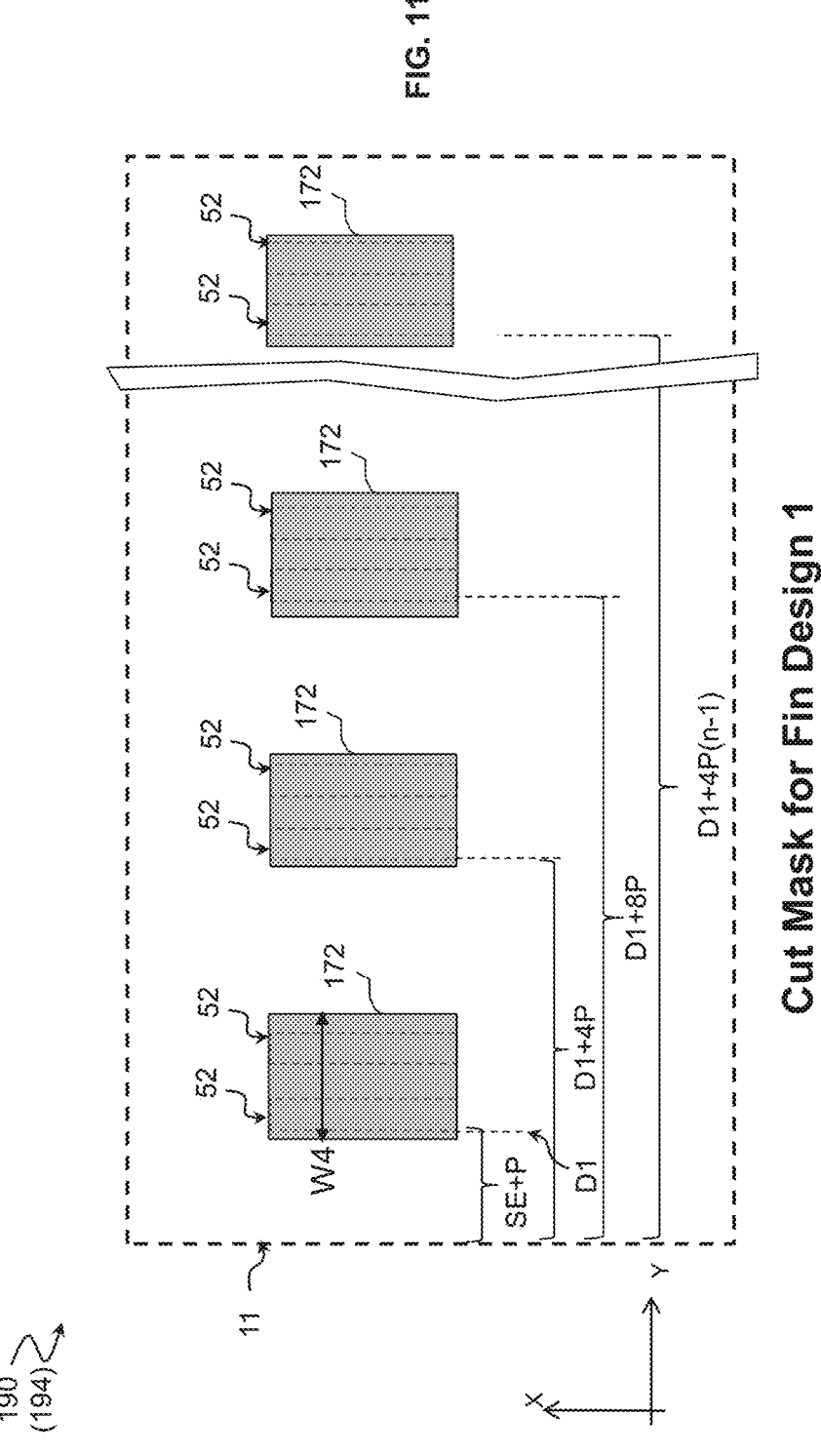
Figure 12:
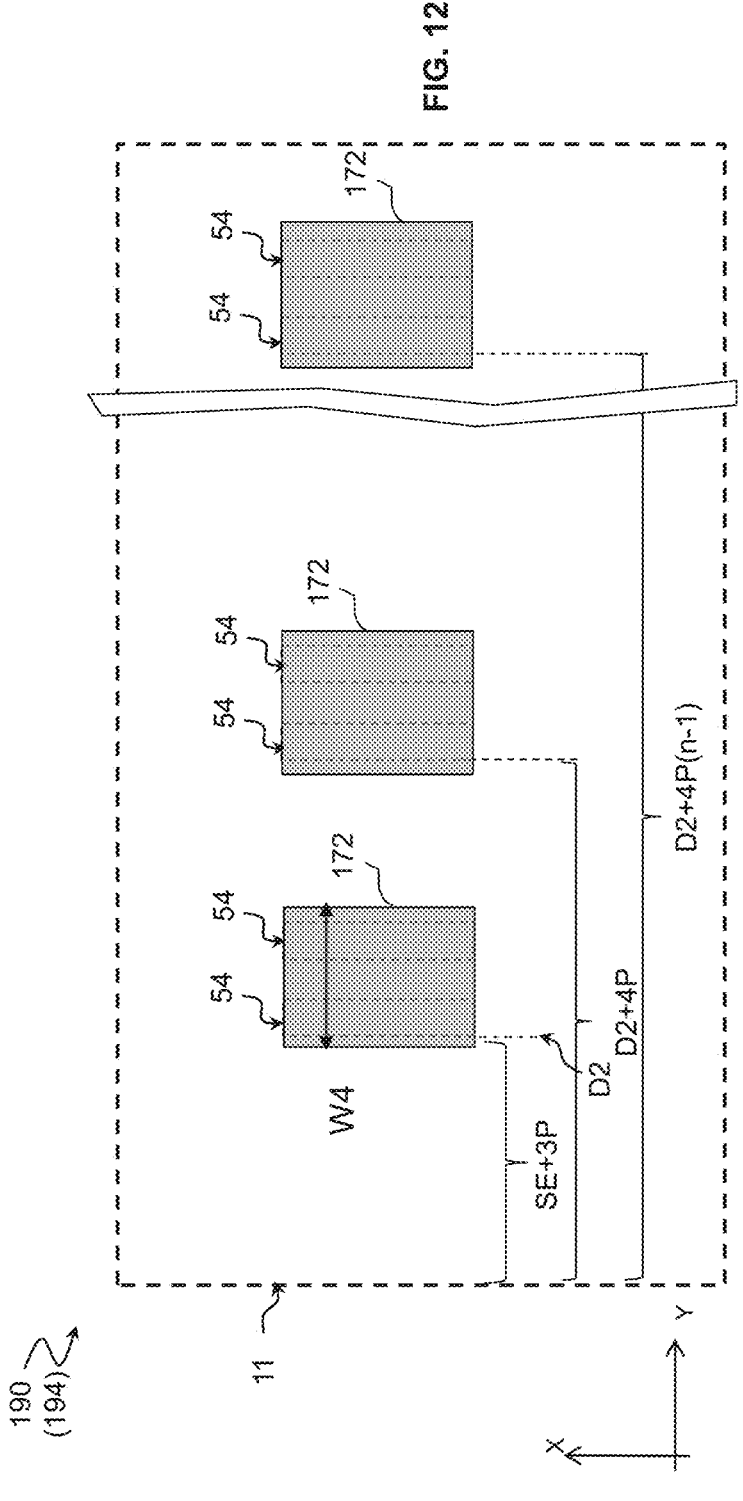
Figure 13:
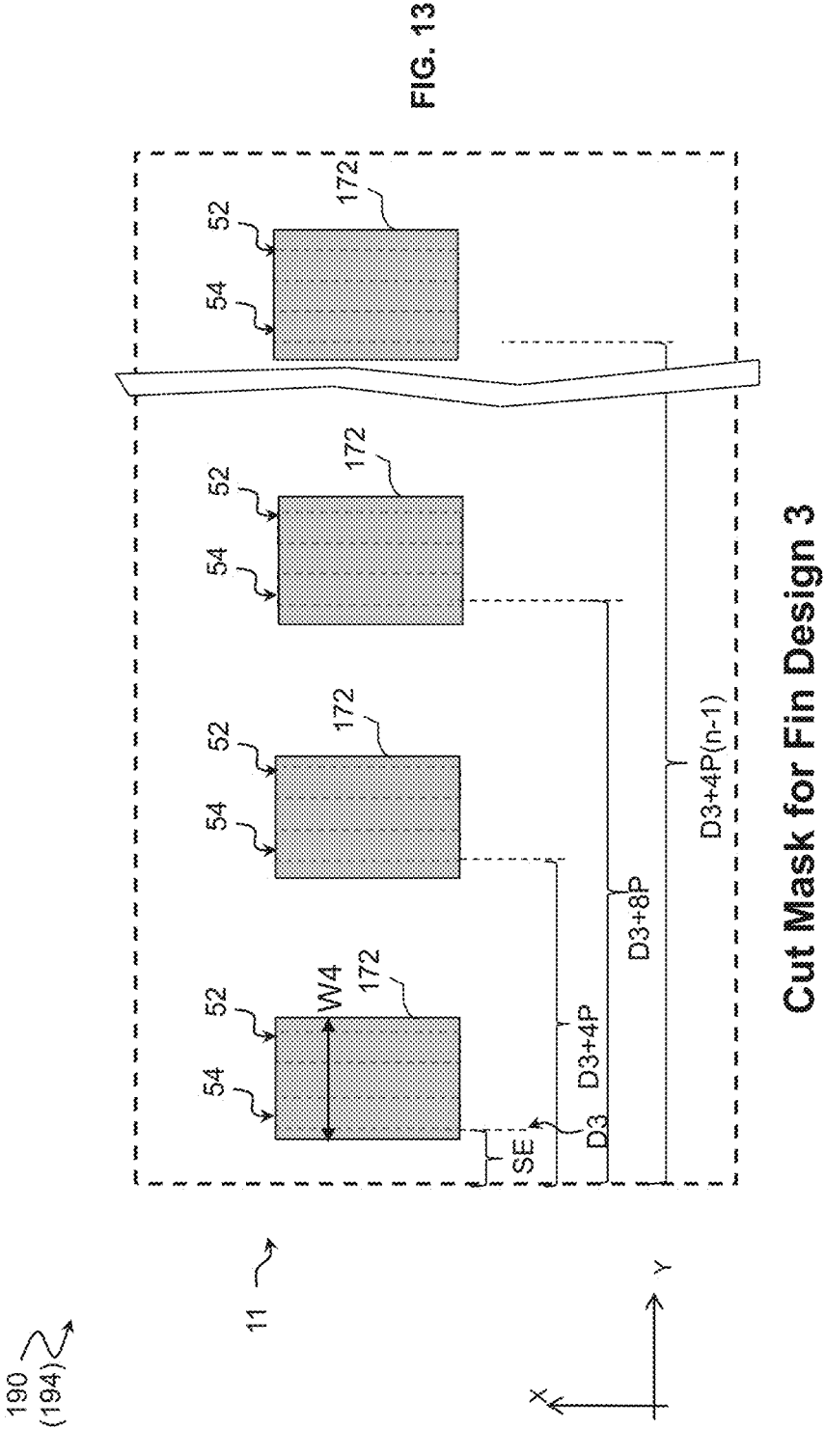
Figure 14:
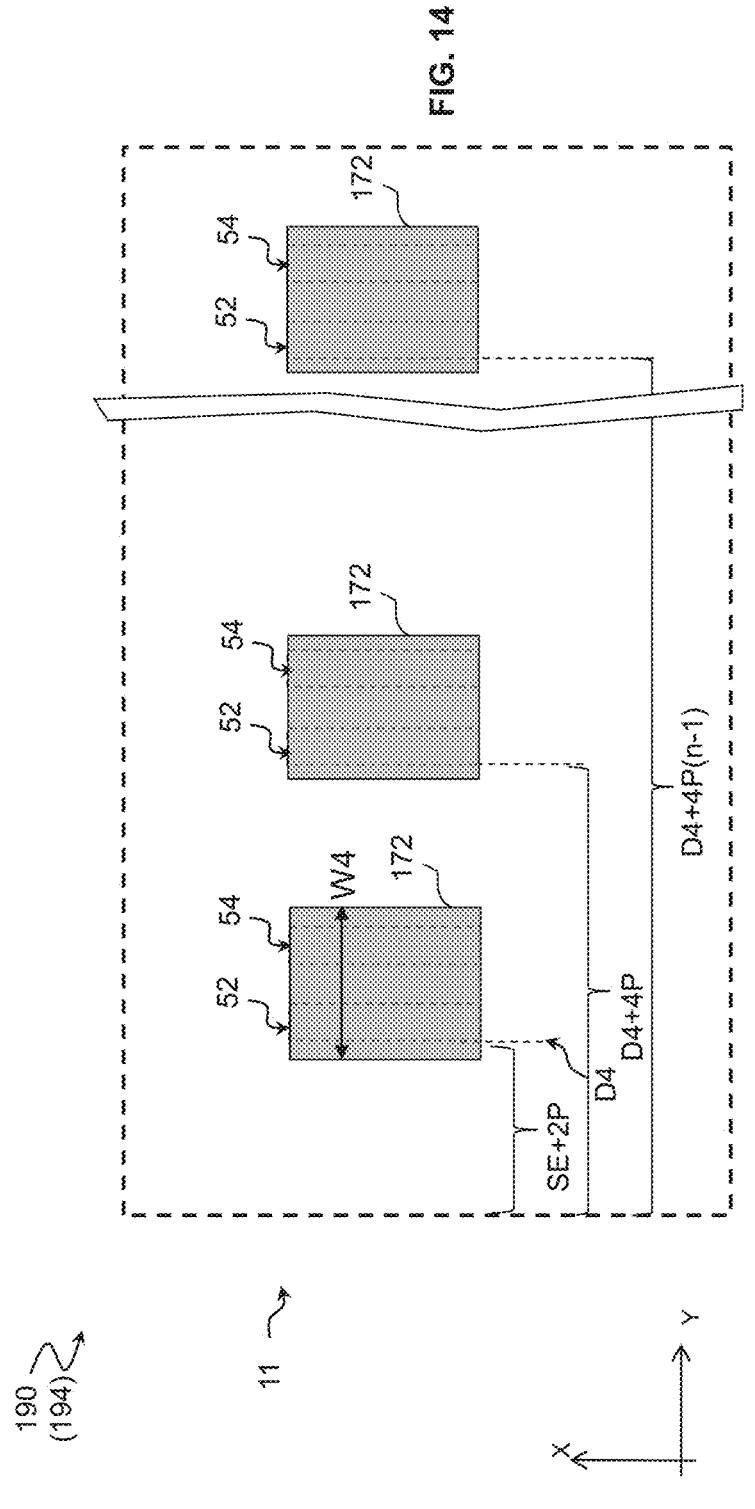

Operation 304 further includes determining location and widths of cut mask patterns 172 based on the design fin patterns 52 and/or 54. The cut mask patterns 172 may be designed as rectangular patterns covering the area of a wafer corresponding to the design fin patterns 52 and/or 54. Areas not covered by the cut mask patterns 172 will be "cut" or etched, while areas covered by the cut mask patterns 172 are protected from being "cut" or etched. For example, if the fin patterns are designed according to FIG. 5, then, the cut mask patterns 172 may be designed as rectangular patterns covering the area of the design fin patterns 52, such as shown in FIG. 11. It is noted that the cut mask patterns 172 may extend beyond the design fin patterns 52 along the "Y" direction to provide process margin. The length of the cut mask patterns 172 equals to the length of the design fin patterns 52. In FIGS. 11-14, the design fin patterns 52 and/or 54 are shown in dashed line to illustrate the width and length of the design fin patterns 52 and/or 54 relative to those of the cut mask patterns 172. If the fin patterns are designed according to FIG. 6, then, the cut mask patterns 172 may be designed as rectangular patterns covering the area of the design fin patterns 54, such as shown in FIG. 12. If the fin patterns are designed according to FIG. 7, then, the cut mask patterns 172 may be designed as rectangular patterns covering the area of the design fin patterns 54 and 52, such as shown in FIG. 13. If the fin patterns are designed according to FIG. 8, then, the cut mask patterns 172 may be designed as rectangular patterns covering the area of the design fin patterns 52 and 54, such as shown in FIG. 14.

At operation 306, the method 300 manufactures a set of masks (or photomasks) 190, as discussed with reference to the mask house 130 in FIG. 1. The set of masks 190 include a mandrel mask 192 having the mandrel mask patterns 22, such as shown in FIG. 10. The set of masks 190 also include a cut mask 194 having the cut mask patterns 172, such as shown in FIG. 11, 12, 13, or 14.

FIG. 15 illustrates a flowchart of a method 400 of manufacturing ICs 160 (for example, by the IC manufacturer 150) according to various aspects of the present disclosure. Method 400 is merely an example and is not intended to limit the present disclosure beyond what is explicitly recited in the claims. Additional operations can be provided before, during, and after method 400, and some operations described can be replaced, eliminated, or moved around for additional embodiments of the method 400.

Referring to FIGS. 15, 16A, and 16B, method 400 at operation 402 forms mandrels 22 on a substrate 12. In the depicted embodiments, the mandrels 22 are protruding features (also known as line patterns). In an alternative embodiment, the mandrels 22 may be trenches. In some embodiments, the substrate 12 includes silicon and optionally other semiconductor or dielectric material layers formed thereon. The substrate 12 may include other suitable semiconductor, such as germanium, a compound semiconductor, such as silicon carbide, indium arsenide, or indium phosphide, or an alloy semiconductor, such as silicon germanium carbide, gallium arsenic phosphide, or gallium indium phosphide. The substrate 12 may further include various doped regions, or dielectric features.

Before forming the mandrels 22, method 400 first deposits a patterning layer (or a second mandrel layer) 14 over the substrate 12 and a patterning layer (or a first mandrel layer) 16 over the patterning layer 14. The patterning layers 16 and 14 include suitable hard mask materials such as silicon oxide or silicon nitride and may each be formed by one or more deposition techniques, such as thermal oxidation, chemical vapor deposition (CVD), and physical vapor deposition (PVD). In the present embodiments, the region within the substrate 12 defined by a dashed line in FIG. 16A (and the subsequent figures) indicates a portion from which semiconductor fins 52 and/or 54 are formed. Though not depicted, the semiconductor fins 52 and/or 54 may be formed in a semiconductor layer distinct from and deposited over the substrate 12.

The mandrels 22 are formed by patterning the patterning layer 16 with a procedure including lithography and etching processes. For example, a photoresist (or resist) layer 18 is formed on the patterning layer 16 using a spin-coating process and soft baking process. Then, the photoresist layer 18 is exposed to a radiation using the mask 192 manufactured by method 300, such as shown in FIG. 10. The exposed photoresist layer is developed using post-exposure baking, developing, and hard baking thereby forming a patterned photoresist layer 18 over the patterning layer 16. Subsequently, the patterning layer 16 is etched through the openings of the patterned photoresist layer 18, forming the mandrels 22. The etching process may include a dry (or plasma) etching, a wet etching, other suitable etching methods, or combinations thereof. The patterned photoresist layer 18 is removed thereafter using a suitable process, such as wet stripping or plasma ashing.

Figures 16C, 16D:
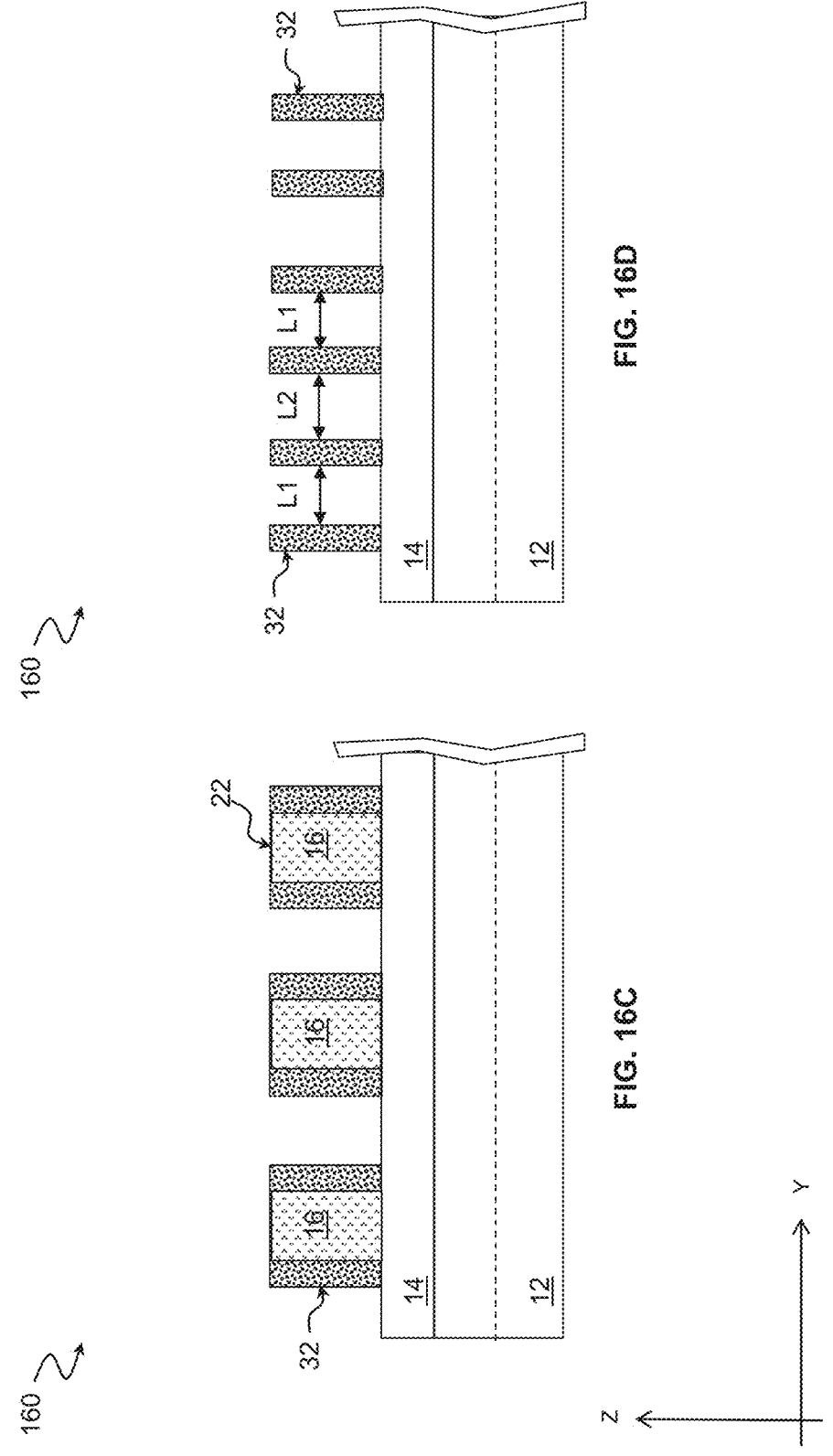

Referring to FIGS. 15 and 16C, method 400 at operation 404 forms spacers 32 on sidewalls of the mandrels 22. In the present embodiments, a spacer layer is first deposited conformally over the substrate 12, such that it is formed on the sidewalls of and completely surrounds each mandrel 22. In some embodiments, the spacer layer is formed to a substantially uniform thickness. The spacer layer may include one or more material different from the mandrels 22 and the patterning layer 14 to introduce etching selectivity therebetween. The spacer layer may include a dielectric material, such as titanium nitride, silicon nitride, or titanium oxide. After being deposited by a suitable process, such as ALD, CVD, PVD, other suitable processes, or combinations thereof, the spacer layer is anisotropically etched by a suitable etching process, such as a plasma dry etching process, leaving behind the spacers 32 on the sidewalls of the mandrels 22. In an alternative embodiment, spacers 32 are formed on sidewalls of another structure that is derived from the mandrels 22.

Referring to FIGS. 15 and 16D, method 400 at operation 406 removes the mandrels 22 and leaves the spacers 32 standing over the patterning layer 14. The etching process may be a wet etching, a dry etching, or a combination thereof and is selectively tuned to remove the mandrels 22 but not, or not substantially, the spacers 32. In some embodiments, due to processing variations and their relative positions to the mandrels 22, the spacers 32 may not be equally spaced from each other along the Y direction. For example, as depicted in FIG. 16D, two neighboring spacers 32 within a first set of spacers may be separated by a distance L1 and the first set of spacers may be separated from an adjacent set of spacers by a distance L2 that is greater than the distance L1.

Figures 16E, 16F:
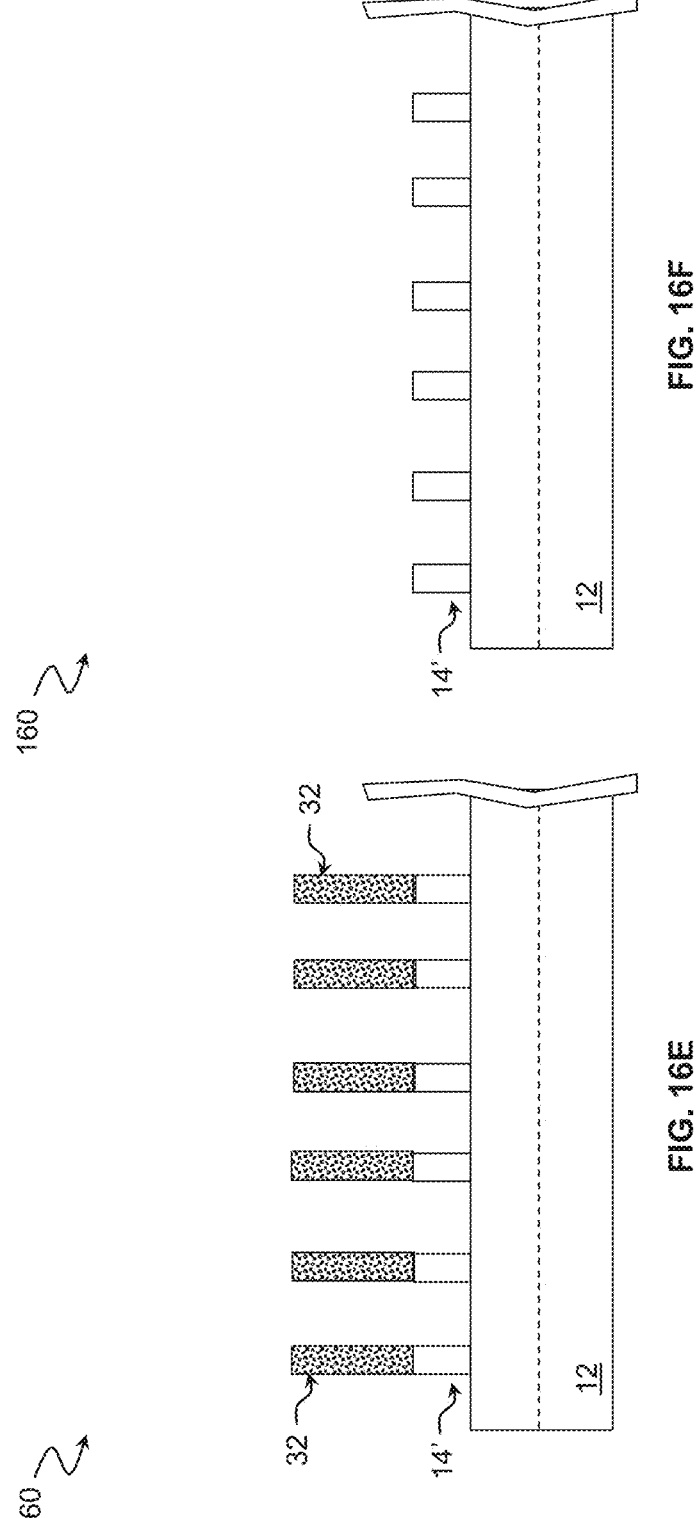

Referring to FIGS. 15 and 16E, method 400 at operation 408 etches the patterning layer 14 using the spacers 32 as an etch mask to form second mandrels 14'. The etching process may be a wet etching, a dry etching, or a combination thereof. Thereafter, the spacers 32 are removed, leaving second mandrels 14' over the substrate 12 such as shown in FIG. 6F.

Figure 16G:
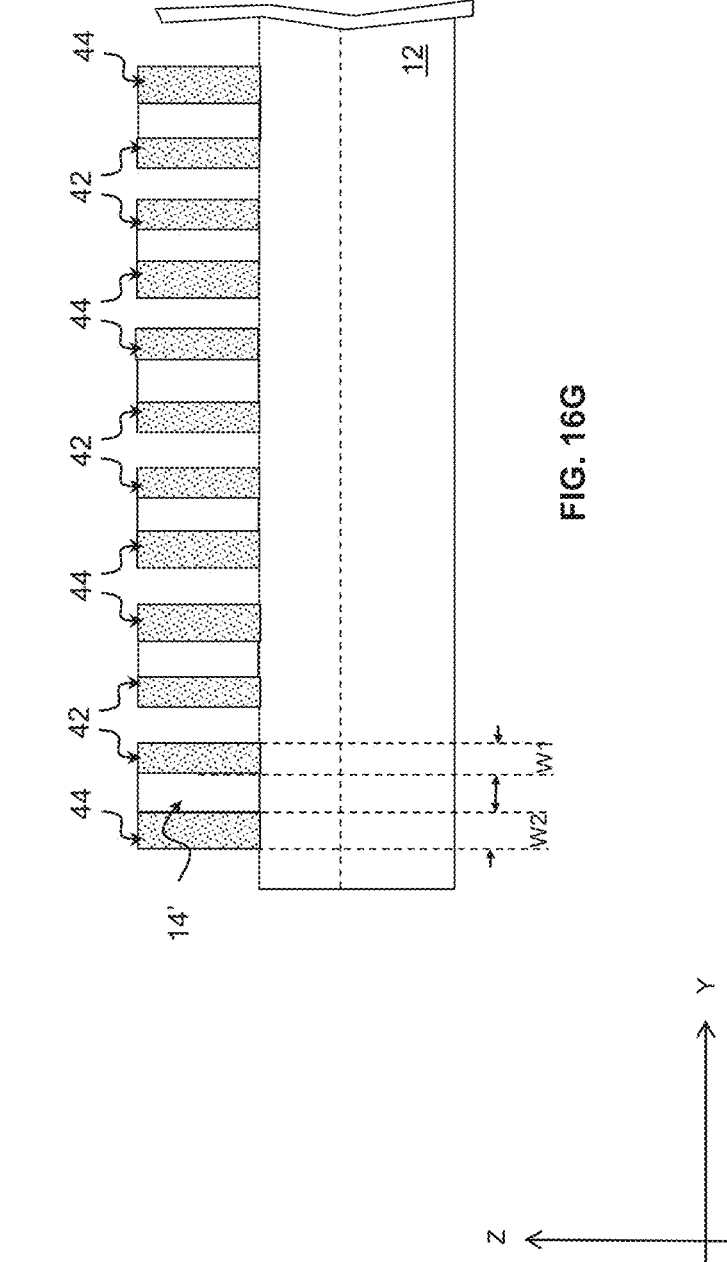

Referring to FIGS. 15 and 16G, method 400 at operation 410 forms spacers 42 and 44 on sidewalls of the second mandrels 14'. In the present embodiments, a spacer layer is first deposited conformally over the substrate 12, such that it is formed on the sidewalls of and completely surrounds second mandrels 14'. The spacer layer may include one or more material different from the second mandrels 14' and the substrate 12 to introduce etching selectivity therebetween and may include a dielectric material, such as titanium nitride, silicon nitride, or titanium oxide. Similar to the process of forming the spacers 32, the spacer layer is first deposited over the substrate and subsequently etched by an anisotropic etching process, leaving behind the spacers 42 and 44.

In the present embodiments, the spacers 42 and 44 are formed to different widths, a width W1 and a width W2, respectively. In the present embodiments, the width W1 is less than the width W2. As discussed above, two adjacent spacers 32 may be separated from each other by either the distance L1 or the distance L2, depending upon their relative positions to the mandrels 22. Such difference in separation distance creates different deposition environment under which the spacers 42 and 44 are processed. For example, a relatively small separation distance (e.g., the distance L1) between the spacers 32 may limit loading effect during the deposition process and may cause the resulting spacers (e.g., the spacers 42) to be formed to a smaller width (e.g., the width W1) than the spacers (e.g., the spacers 44) formed where the separation distance is relatively large (e.g., the distance L2). As will be discussed below, such variations in spacer width are transferred to the fins of the IC device 160 during the subsequent patterning process.

Referring to FIGS. 15 and 16H, method 400 at operation 412 removes the second mandrels 14' and leaves the spacers 42 and 44 on the substrate 12. The second mandrels 14' may be removed using one or more etching processes that are selectively tuned to remove second mandrels 14', with no, or insignificant, etching of the spacers 42 and 44 and the substrate 12.

Figure 16I:
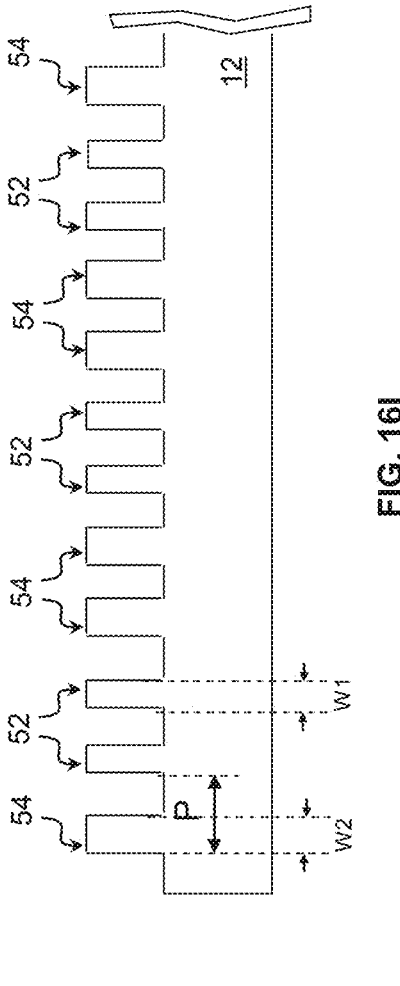

Thereafter, referring to FIGS. 15 and 16I, method 400 at operation 414 etches the substrate 12 using the spacers 42 and 44 as an etch mask to form fins 52, which correspond to the spacers 42, and fins 54, which correspond to the spacers 44. In the present embodiments, the fins 52 and 54 protrude from the substrate 12 and are formed to substantially the same widths as the spacers 42 and 44, respectively.

Figure 17A:
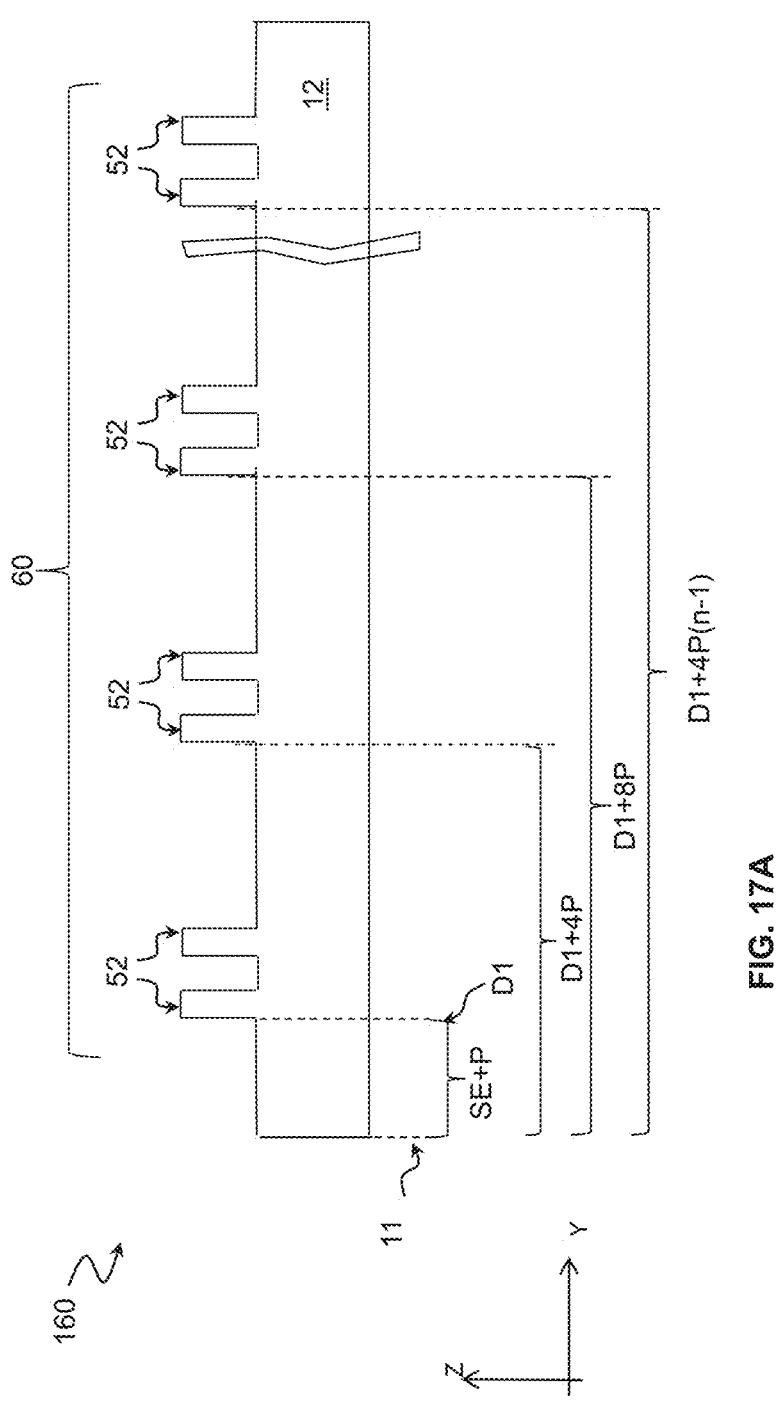
FIGS. 17A, 17B, 17C, and 17D illustrate cross-sectional views of the example IC device after a cut process according to various aspects of the present disclosure.
Figure 17B:
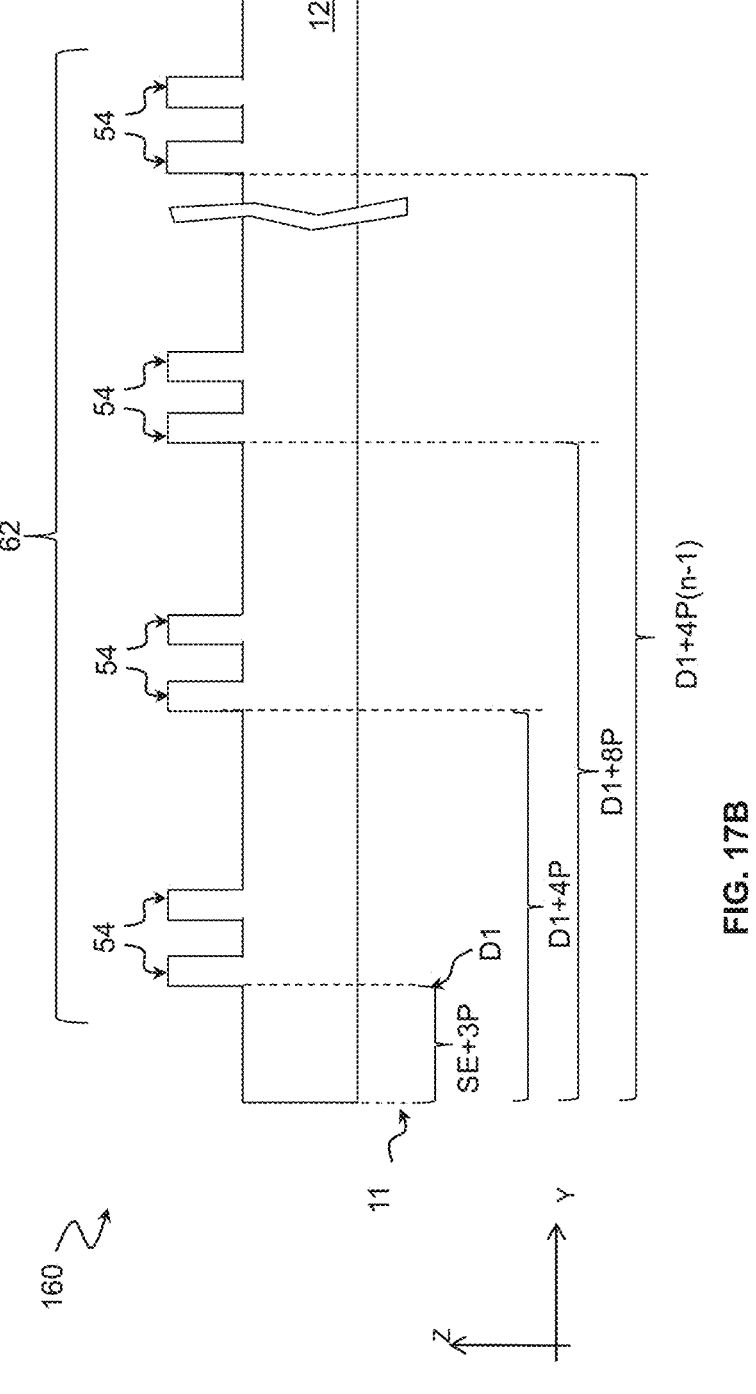
Figure 17C:
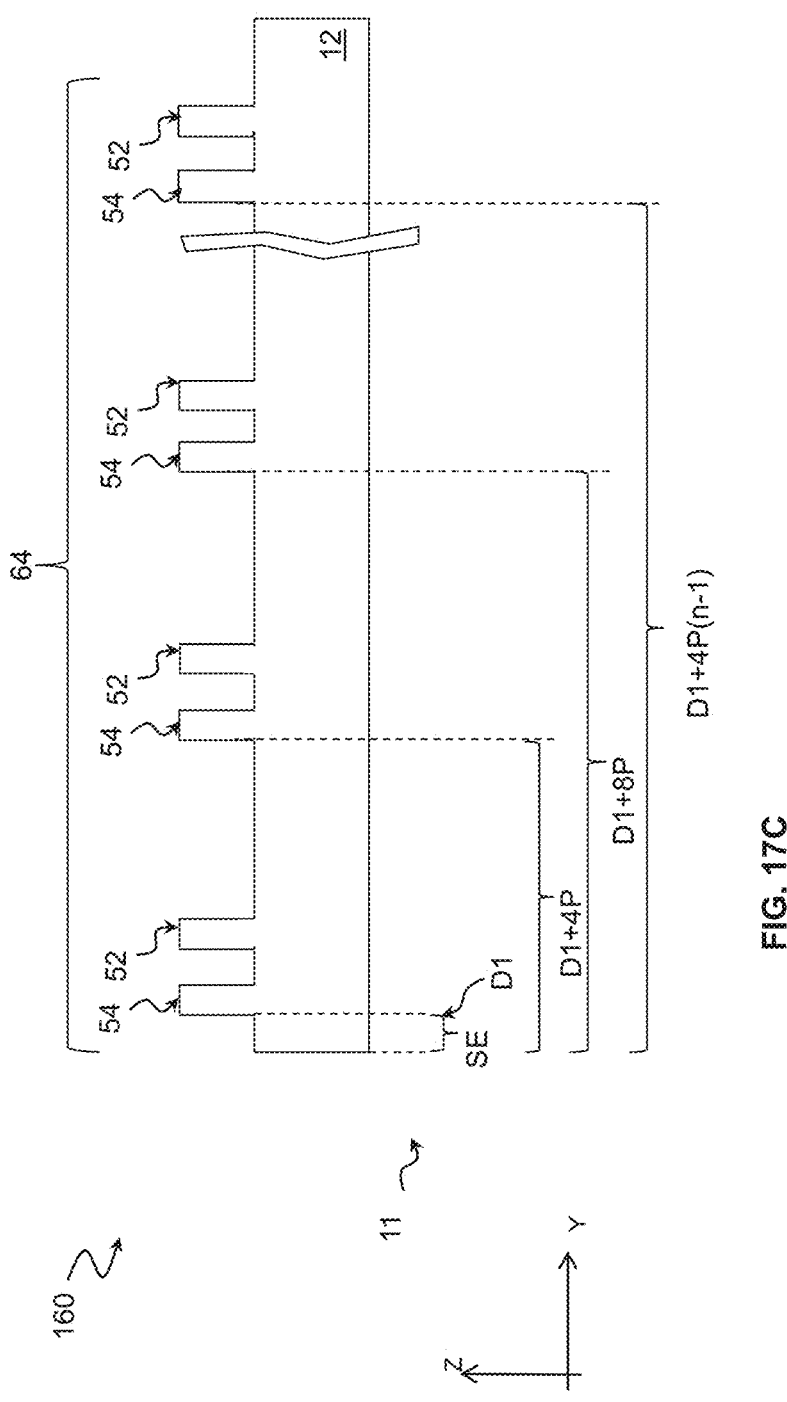
Figure 17D:
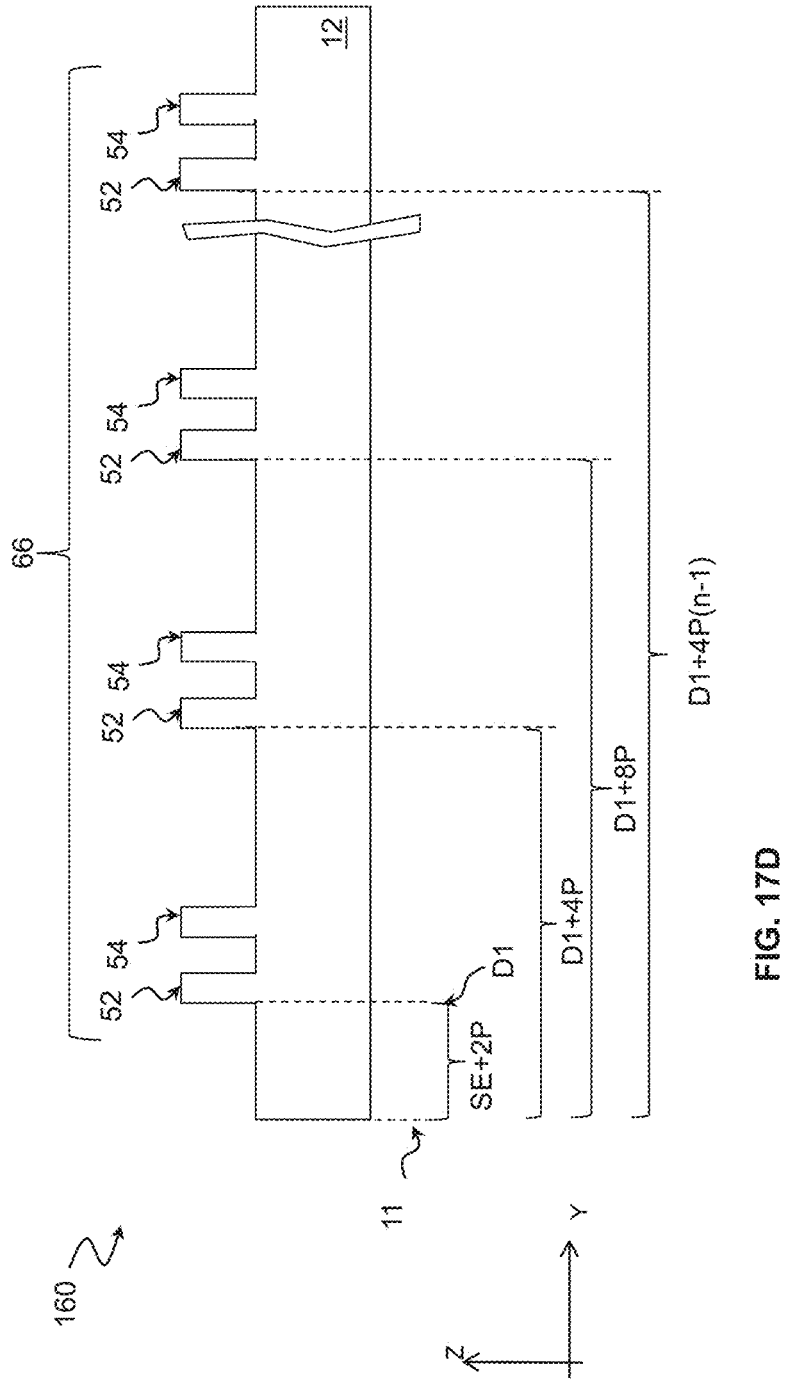

Referring to FIG. 15, method 400 at operation 416 performs a cut process to remove the fins 52 and/or 54 that are not desired. In an embodiment, the cut process applies one of the cut masks 194 shown in FIGS. 11, 12, 13, and 14. In that regard, FIG. 17A illustrates the IC device 160 after the cut mask 194 shown in FIG. 11 is applied, FIG. 17B illustrates the IC device 160 after the cut mask 194 shown in FIG. 12 is applied, FIG. 17C illustrates the IC device 160 after the cut mask 194 shown in FIG. 13 is applied, and FIG. 17D illustrates the IC device 160 after the cut mask 194 shown in FIG. 14 is applied.

Referring to FIG. 15, method 400 at operation 418 may perform further fabrications. For example, method 400 may form an isolation structure (such as shallow trench isolation or STI) between adjacent fins 52 and/or 54 to isolate the fins, form a gate structure engaging the fins, form source and drain regions, and so on.

Although not intended to be limiting, the present disclosure provides many benefits to the manufacturing of an IC. The present embodiments provide methods of designing fins for a mandrel-spacer-spacer patterning process to improve device performance. In some embodiments, selecting the fins includes identifying pairs of fins having the same dimensions obtained as a result of their relative positions to a mandrel pattern from which they are fabricated. Because of the fin selection process, various transistors (e.g., field effect transistors or FETs) formed from the selected fins demonstrate substantially similar device performance, thereby improving reliability and consistency of an IC device.

In one example aspect, the present disclosure is directed to a method that includes receiving an integrated circuit (IC) design layout, wherein the IC design layout includes a design boundary and a pair of design fin patterns, the pair of design fin patterns having a fin spacing and a fin pitch. The method further includes creating a mandrel mask pattern, which includes determining an edge of the mandrel mask pattern based on a location of the design boundary, the fin spacing, and the fin pitch and determining a width of the mandrel mask pattern based on the fin spacing and the fin pitch. The method further includes creating a cut mask pattern based on the mandrel mask pattern and the pair of design fin patterns, wherein the cut mask pattern is configured to protect an area of a semiconductor wafer corresponding to the pair of design fin patterns. The method further includes fabricating a mandrel mask having the mandrel mask pattern and fabricating a cut mask having the cut mask pattern.

In an embodiment, the method further includes manufacturing the semiconductor wafer using the mandrel mask and the cut mask. In an embodiment of the method, the edge of the mandrel mask pattern is determined to be away from the design boundary by a distance that equals to twice of the fin pitch plus half of the fin spacing. In a further embodiment, the edge of the mandrel mask pattern is determined to be between the design boundary and the pair of design fin patterns. In another further embodiment, the edge of the mandrel mask pattern is determined to be aligned with an outer edge of one of the pair of design fin patterns. In yet another further embodiment, the edge of the mandrel mask pattern is determined to be aligned with an inner edge of one of the pair of design fin patterns.

In an embodiment of the method, the width of the mandrel mask pattern is determined to be equal to twice of the fin pitch minus the fin spacing. In another embodiment, the creating of the mandrel mask pattern further includes determining a length for the mandrel mask pattern based on the pair of design fin patterns.

In another example aspect, the present disclosure is directed to a method that includes receiving a design layout, wherein the design layout includes a design boundary and multiple pairs of design fin patterns, each pair of the multiple pairs of design fin patterns having a fin spacing, each design fin pattern in the multiple pairs of design fin patterns having a fin width. The method further includes creating mandrel mask patterns, which includes determining an edge of a first one of the mandrel mask patterns based on a location of the design boundary, the fin spacing, and the fin width; determining an edge of a second one of the mandrel mask patterns based on the edge of the first one of the mandrel mask patterns, the fin spacing, and the fin width; and determining a width for the first and the second ones of the mandrel mask patterns based on the fin spacing and the fin width. The method further includes creating a cut mask pattern based on the mandrel mask patterns and the multiple pairs of design fin patterns, wherein the cut mask pattern is configured to protect areas of a semiconductor wafer corresponding to the multiple pairs of design fin patterns. The method further includes fabricating a mandrel mask having the mandrel mask patterns and fabricating a cut mask having the cut mask pattern.

In an embodiment, the method further includes manufacturing the semiconductor wafer using the mandrel mask and the cut mask. In an embodiment of the method, the edge of the first one of the mandrel mask patterns is determined to be away from the design boundary by a distance that equals to twice of the fin width plus two and half times of the fin spacing. In a further embodiment, the edge of the second one of the mandrel mask patterns is determined to be away from the edge of the first one of the mandrel mask patterns by a distance that equals to four times of the fin width plus four times of the fin spacing.

In another embodiment of the method, the edge of the first one of the mandrel mask patterns is determined to be between the design boundary and a first pair of the multiple pairs of design fin patterns, wherein the first pair is closest to the design boundary among the multiple pairs of design fin patterns.

In an embodiment, the edge of the first one of the mandrel mask patterns is determined to be aligned with an outer edge of one of the multiple pairs of design fin patterns. In another embodiment, the edge of the first one of the mandrel mask patterns is determined to be aligned with an inner edge of one of the multiple pairs of design fin patterns. In yet another embodiment, the width of the first and the second ones of the mandrel mask patterns is determined to be equal to twice of the fin width plus the fin spacing.

In yet another example aspect, the present disclosure is directed to a method that includes receiving a design layout having a design boundary and a pair of design fin patterns, the pair of design fin patterns having a fin spacing and a fin pitch. The method further includes creating a mandrel mask pattern. The creating of the mandrel mask pattern includes determining an edge of the mandrel mask pattern to be away from the design boundary by a distance that equals to twice of the fin pitch plus half of the fin spacing and determining a width for the mandrel mask pattern to be equal to twice of the fin pitch minus the fin spacing. The method further includes creating a cut mask pattern based on the mandrel mask pattern and the pair of design fin patterns, wherein the cut mask pattern is configured to protect an area of a semiconductor wafer corresponding to the pair of design fin patterns. The method further includes fabricating a mandrel mask having the mandrel mask patterns and fabricating a cut mask having the cut mask pattern.

In an embodiment, the method further includes fabricating the semiconductor wafer using the mandrel mask and the cut mask. In an embodiment, the edge of the mandrel mask pattern is determined to be between the design boundary and the pair of design fin patterns. In another embodiment, the edge of the mandrel mask pattern is determined to be aligned with an edge of one of the pair of design fin patterns.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving an integrated circuit (IC) design layout, wherein the IC design layout includes a design boundary and a pair of design fin patterns, the pair of design fin patterns having a fin spacing and a fin pitch;

creating a mandrel mask pattern, wherein one or more edges of the pair of design fin patterns are associated with edges of mandrel spacers disposed on edges of a mandrel in a semiconductor wafer defined by the mandrel mask pattern, wherein the creating of the mandrel mask pattern includes:

determining an edge of the mandrel mask pattern based on a location of the design boundary, the fin spacing, and the fin pitch, wherein the edge of the mandrel mask pattern defines a location of one of the mandrel spacers, and wherein a location of a spacer formed on an edge of the one of the mandrel spacers corresponds to a location of one of the pair of design fin patterns; and determining a width of the mandrel mask pattern based on the fin spacing and the fin pitch;

creating a cut mask pattern based on the mandrel mask pattern and the pair of design fin patterns, wherein the cut mask pattern is configured to protect an area of the semiconductor wafer corresponding to the pair of design fin patterns and to remove a pair of dummy fin patterns associated with the mandrel mask pattern;

fabricating a mandrel mask having the mandrel mask pattern; and fabricating a cut mask having the cut mask pattern.

2. The method of claim 1, further comprising:

manufacturing the semiconductor wafer using the mandrel mask and the cut mask.

3. The method of claim 1, wherein the edge of the mandrel mask pattern is determined to be away from the design boundary by a distance that equals to twice of the fin pitch plus half of the fin spacing.

4. The method of claim 3, wherein the edge of the mandrel mask pattern is determined to be between the design boundary and the pair of design fin patterns.

5. The method of claim 3, wherein the edge of the mandrel mask pattern is determined to be aligned with an outer edge of one of the pair of design fin patterns.

6. The method of claim 3, wherein the edge of the mandrel mask pattern is determined to be aligned with an inner edge of one of the pair of design fin patterns.

7. The method of claim 1, wherein the width of the mandrel mask pattern is determined to be equal to twice of the fin pitch minus the fin spacing.

8. The method of claim 1, wherein the creating of the mandrel mask pattern further includes:

determining a length for the mandrel mask pattern based on the pair of design fin patterns.

9. A method of a mandrel-spacer double patterning process, comprising:

receiving a design layout, wherein the design layout includes a design boundary and multiple pairs of design fin patterns, each pair of the multiple pairs of design fin patterns having a fin spacing, each design fin pattern in the multiple pairs of design fin patterns having a fin width;

creating mandrel mask patterns, wherein the mandrel mask patterns define mandrels spacers disposed on edges of mandrels defined by the mandrel mask patterns in a semiconductor wafer, wherein edges of the design fin patterns are determined by the mandrel spacers, the creating of the mandrel mask patterns including:

determining an edge of a first one of the mandrel mask patterns based on a location of the design boundary, the fin spacing, and the fin width, wherein the edge of the first one of the mandrel mask patterns aligns with an edge of a first one of the mandrel spacers, and wherein a spacer disposed on an edge of the first one of the mandrel spacers aligns with one of the design fin patterns;

determining an edge of a second one of the mandrel mask patterns based on the edge of the first one of the mandrel mask patterns, the fin spacing, and the fin width; and determining a width of the first and the second ones of the mandrel mask patterns based on the fin spacing and the fin width;

creating a cut mask pattern based on the mandrel mask patterns and the multiple pairs of design fin patterns, wherein the cut mask pattern is configured to protect areas of the semiconductor wafer corresponding to the multiple pairs of design fin patterns and to remove at least a pair of dummy fin patterns associated with the mandrel mask patterns and located between two adjacent pairs of the multiple pairs of design fin patterns;

fabricating a mandrel mask having the mandrel mask patterns; and fabricating a cut mask having the cut mask pattern.

10. The method of claim 9, further comprising:

manufacturing the semiconductor wafer using the mandrel mask and the cut mask.

11. The method of claim 9, wherein the edge of the first one of the mandrel mask patterns is determined to be away from the design boundary by a distance that equals to twice of the fin width plus two and half times of the fin spacing.

12. The method of claim 11, wherein the edge of the second one of the mandrel mask patterns is determined to be away from the edge of the first one of the mandrel mask patterns by a distance that equals to four times of the fin width plus four times of the fin spacing.

13. The method of claim 9, wherein the edge of the first one of the mandrel mask patterns is determined to be between the design boundary and a first pair of the multiple pairs of design fin patterns, wherein the first pair is closest to the design boundary among the multiple pairs of design fin patterns.

14. The method of claim 9, wherein the edge of the first one of the mandrel mask patterns is determined to be aligned with an outer edge of one of the multiple pairs of design fin patterns.

15. The method of claim 9, wherein the edge of the first one of the mandrel mask patterns is determined to be aligned with an inner edge of one of the multiple pairs of design fin patterns.

16. The method of claim 9, wherein the width of the first and the second ones of the mandrel mask patterns is determined to be equal to twice of the fin width plus the fin spacing.

17. A method, comprising:

receiving a design layout, wherein the design layout includes a design boundary and a pair of design fin patterns, the pair of design fin patterns having a fin spacing and a fin pitch;

creating a mandrel mask pattern, including:

determining a first edge of the mandrel mask pattern, wherein a location of a first one of the pair of design fin patterns corresponds to a location of a spacer disposed on a first edge of a first mandrel spacer pattern, wherein a location of the first mandrel spacer pattern corresponds to the first edge of the mandrel mask pattern, and wherein the first edge of the mandrel mask pattern is determined to be away from the design boundary by a distance that equals to twice of the fin pitch plus half of the fin spacing; and determining a width for the mandrel mask pattern to be equal to twice of the fin pitch minus the fin spacing, thereby also determining a second edge of the mandrel mask pattern based on a location of the first edge and the width of the mandrel mask pattern, the second edge of the mandrel mask pattern opposing the first edge of the mandrel mask pattern;

creating a cut mask pattern based on the mandrel mask pattern and the pair of design fin patterns, wherein the cut mask pattern is configured to protect an area of a semiconductor wafer corresponding to the pair of design fin patterns and to remove at least one dummy fin pattern associated with a second edge of the first mandrel spacer pattern or with an edge of a second mandrel spacer pattern adjacent to the first mandrel spacer pattern;

fabricating a mandrel mask having the mandrel mask patterns; and fabricating a cut mask having the cut mask pattern.

18. The method of claim 17, further comprising:

fabricating the semiconductor wafer using the mandrel mask and the cut mask.

19. The method of claim 17, wherein the first edge of the mandrel mask pattern is determined to be between the design boundary and the pair of design fin patterns.

20. The method of claim 17, wherein the first edge of the mandrel mask pattern is determined to be aligned with an edge of one of the pair of design fin patterns.

* * * * *